United States Patent
Nakamura et al.

(10) Patent No.: US 6,258,649 B1
(45) Date of Patent: Jul. 10, 2001

(54) SEMICONDUCTOR INTEGRATED CIRCUIT DEVICE AND METHOD OF MANUFACTURING THE SAME

(75) Inventors: Yoshitaka Nakamura; Masayoshi Hirasawa, both of Ome; Isamu Asano, Iruma; Tsuyoshi Tamaru, Hachioji; Satoru Yamada; Keizo Kawakita, both of Ome; Toshihiro Sekiguchi, Hidaka; Yoshitaka Tadaki, Hannou; Takuya Fukuda, Kodaira, all of (JP)

(73) Assignee: Hitachi, LTD, Tokyo (JP)

( * ) Notice: Subject to any disclaimer, the term of this patent is extended or adjusted under 35 U.S.C. 154(b) by 0 days.

(21) Appl. No.: 09/389,231

(22) Filed: Sep. 3, 1999

(30) Foreign Application Priority Data

Sep. 3, 1998 (JP) .................................................. 10-250162

(51) Int. Cl.[7] .................... H01L 21/8234; H01L 21/8244
(52) U.S. Cl. .......................... 438/238; 438/241; 438/253; 438/622; 438/666; 438/791
(58) Field of Search ..................................... 438/238, 622, 438/624, 631, 668, 688, 780, 253, 787, 241, 791, 666

(56) References Cited

U.S. PATENT DOCUMENTS

| 5,930,624 | * | 7/1999 | Murata et al. | 438/253 |
| 6,150,689 | * | 11/2000 | Narui et al. | 257/306 |
| 6,168,985 | * | 1/2001 | Asano et al. | 438/241 |

FOREIGN PATENT DOCUMENTS 7-7084    1/1995   (JP) .

* cited by examiner

Primary Examiner—Matthew Smith
Assistant Examiner—Igwe U. Anya
(74) Attorney, Agent, or Firm—Antonelli, Terry, Stout & Kraus, LLP

(57) ABSTRACT

In order to improve connection reliability of a feeding interconnection connected to an electrode of each of the information storage capacitive elements of a DRAM, the formation of a through hole for connecting the information storage capacitive element formed over each memory cell selection MISFET and a feeding interconnection is performed in a process different from that for the formation of a through hole for connecting an interconnection of a second wiring layer in a peripheral circuit, which is formed over the information storage capacitive element and an interconnection corresponding to a first wiring layer.

11 Claims, 38 Drawing Sheets

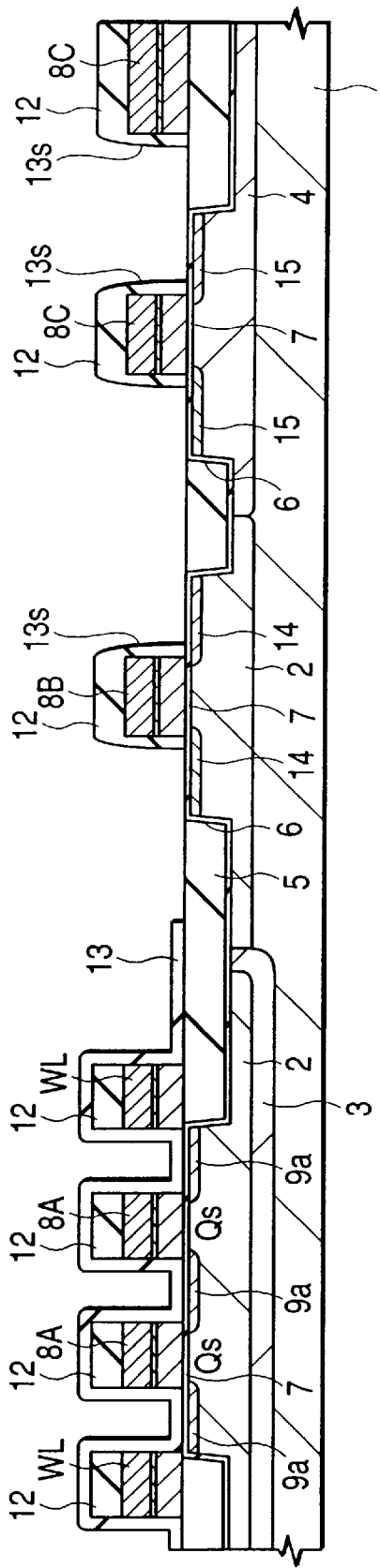
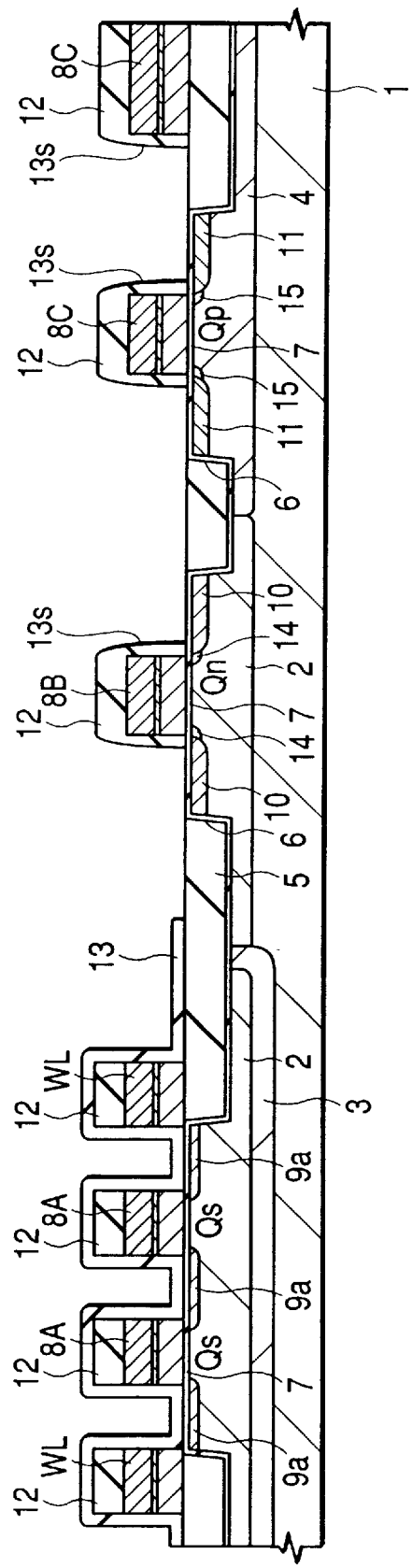

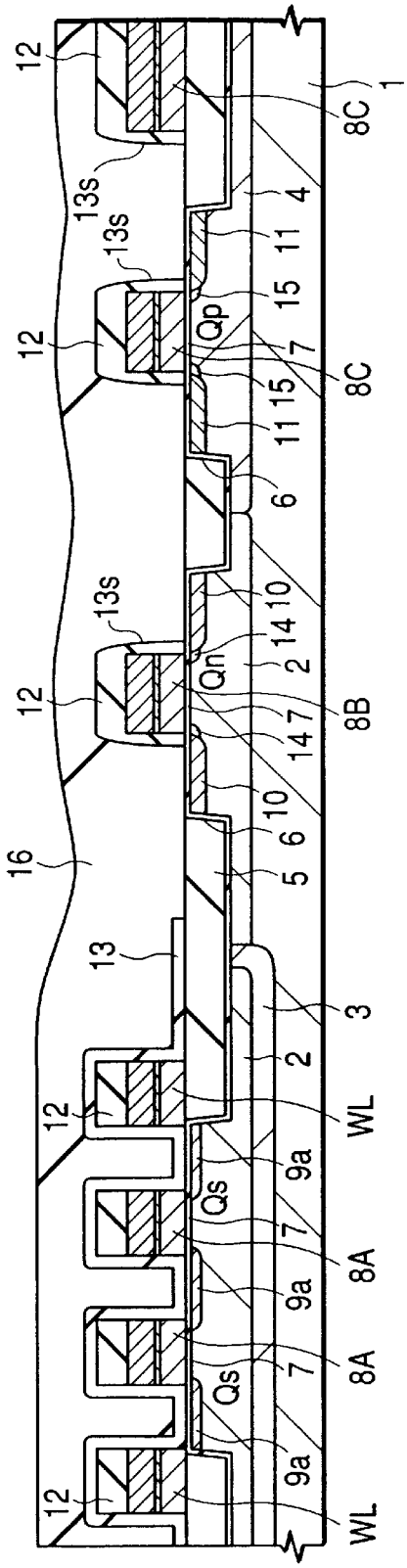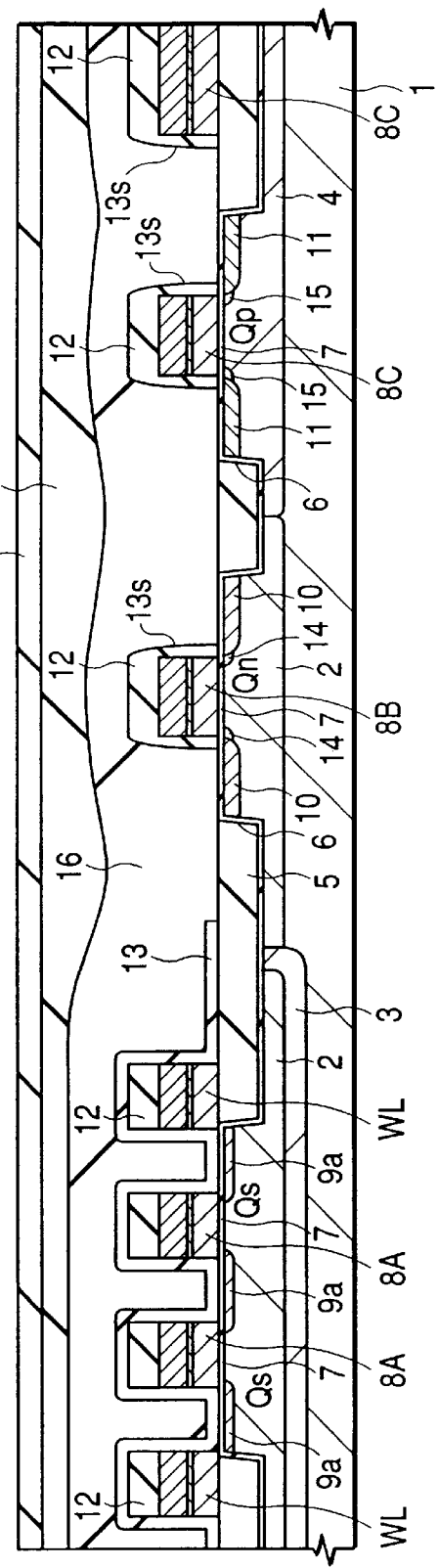

SEMICONDUCTOR INTEGRATED CIRCUIT DEVICE AND METHOD OF MANUFACTURING THE SAME

BACKGROUND OF THE INVENTION

The present invention relates to a semiconductor integrated circuit device and to a technique for the manufacture, thereof and, more particularly, the invention relates to a technique which is effective for application to a semiconductor integrated circuit device having a DRAM (Dynamic Random Access Memory).

Memory cells of a DRAM are respectively placed at points where a plurality of word lines and a plurality of bit lines, disposed over a principal or main surface of a semiconductor substrate intersect in matrix form. The memory cell comprises one memory cell selection MISFET (Metal Insulator Semiconductor Field Effect Transistor) and one information capacitive element (capacitor) electrically connected in series with the memory cell selection MISFET.

The memory cell selection MISFET is formed in an active region whose periphery is surrounded by a device separation region The memory cell selection MISFET is composed principally of a gate oxide film, a gate electrode formed integrally with each word line, and a pair of semiconductor regions which form a source and a drain. Each bit line is placed above the memory cell selection MISFET and is electrically connected to one of the source and drain shared by two memory cell selection MISFETs disposed adjacent to each other in its extending direction. Similarly, the information storage capacitive element is disposed above the memory cell selection MISFET and is electrically connected to the other of the source and drain.

Japanese Patent Application Laid-Open No. Hei 7-7084 discloses a DRAM of a capacitor over bitline (COB) structure wherein information storage capacitive elements are placed over the bit lines. According to the DRAM described in the publication, a lower electrode (storage electrode) of each information storage capacitive element disposed above the bit line is processed into cylindrical form to make up for a reduction in the amount of an electrical charge stored in each information storage capacitive element with macro-fabrication of each memory cell, whereby the surface area thereof is increased, and a capacitive insulating film and an upper electrode (plate electrode) are formed over the lower electrode.

According to the DRAM described in the publication as well, a frame-shaped groove (channel), which surrounds a memory array, is defined in the boundary between the memory array and a peripheral circuit region, and a thick insulating film is deposited over the peripheral circuit region outside the channel, whereby a step-like offset between the memory array and the peripheral circuit is settled and the flattening of the peripheral circuit region is implemented together. The groove is defined simultaneously in a process step for processing the lower electrode of each information storage capacitive element into cylindrical form. An inner wall of the groove is composed of the same material (polycrystal silicon film) as the lower electrode.

SUMMARY OF THE INVENTION

According to the DRAM of the prior art, since the wall surface of the lower electrode which is processed into cylindrical form, is utilized as an effective region for ensuring the amount of stored electrical charges, the height of the lower electrode and the depth of the groove (channel) increase as each memory cell is miniaturized. With such increase in size, the insulating film formed in the peripheral circuit region lying outside the groove (channel) also further increases in thickness. As a result, a through hole for connecting an upper-layer wire or interconnection formed over the thick insulating film in the peripheral circuit region and a lower-layer interconnection formed below the insulating film also further increases in aspect ratio (depth/diameter of the through hole).

However, when the aspect ratio of the through hole defined in the thick insulating film in the peripheral circuit region increases, a through hole defined in an insulating film between a feeding interconnection for supplying predetermined power to the upper electrode of each information storage capacitive element and the upper electrode and a through hole for connecting an upper-layer interconnection formed over a thick insulating film in a peripheral circuit region and a lower-layer interconnection formed below the insulating film are greatly different in aspect ratio from each other. Therefore, when one attempts to simultaneously form the two through holes in the same process step, the through hole having a small aspect ratio, which is formed over the upper electrode of the information storage capacitive element, is over-etched when an etching condition for the insulating film is matched to the through hole having the large aspect ratio in the peripheral circuit region, thereby penetrating the upper electrode. Therefore, a lower portion of the through hole might reach the lower-layer interconnection at the worst. On the other hand, when the etching condition for the insulating film is matched to the through hole having a low aspect ratio, which is formed above the upper electrode, the bottom of the through hole having the large aspect ratio, which is formed in the peripheral circuit region, does not reach the lower-layer interconnection.

In the DRAM of the prior art as well, metal interconnections corresponding to two layers are formed in a layer above each information storage capacitive element. Since these metal interconnections provided in the layer above the information storage capacitive element are formed with a thickness which is greater than an interconnection formed in a layer below the information storage capacitive element, an insulating film deposited by the normal CVD method lacks in gap-filling characteristic in an interconnection densified region and so difficulties are encounted in embedding it into spaces defined between the interconnections.

As countermeasures against this problem, one may consider that an insulating film covering the metal interconnections is deposited by a high-density plasma CVD method having an excellent gap-filling characteristic. However, the insulating film deposited by the high-density plasma CVD method has a feature that it is apt to be charged up by an electrical charge in a plasma. Therefore, when the insulating film is deposited over a feeding metal interconnection for supplying power to the upper electrode of each information storage capacitive element by the high-density plasma CVD method, electrical charges borne by charged particles in a plasma are transferred to the upper electrode through the feeding metal interconnection, whereby the information storage capacitive element might cause dielectric breakdown.

An object of the present invention is to provide a technique capable of improving the accuracy of processing of a through hole defined in an insulating film between a feeding interconnection for supplying power to an upper electrode of each capacitive element and the upper electrode to thereby enhance the connection reliability of the feeding interconnection.

Another object of the present invention is to provide a technique capable of preventing dielectric breakdown of a capacitive insulating film, which is caused by charge-up of a capacitive element upon growing an insulating film deposited over an interconnection connected to an upper electrode of the capacitive electrode.

The above, and other objects and novel features of the present invention will become more apparent from the description of the present specification and the accompanying drawings.

A summary of typical aspects and features of the invention disclosed in the present application will be briefly explained as follows:

(1) A method of manufacturing a semiconductor integrated circuit device according to the present invention includes the following steps:

(a) a step of forming memory cell selection MISFETs in a memory array region on a main surface of a semiconductor substrate and forming MISFETs for a peripheral circuit in a peripheral circuit region;

(b) a step for forming a first interconnection over the MISFET and thereafter forming a first insulating film over the first interconnection;

(c) a step of defining grooves in the first insulating film in the memory array region and thereafter patterning a first conductive film formed over the first insulating film including the interior of the grooves to thereby form a lower electrode of an information storage capacitive element inside each groove;

(d) a step of patterning a second conductive film formed over the lower electrode through a capacitive insulating film to thereby form an upper electrode of each information storage capacitive element;

(e) a step of forming a second insulating film over each information storage capacitive element and thereafter defining a first through hole in an insulating film including the second insulating film and the first insulating film placed in a layer therebelow;

(f) a step of patterning a third conductive film formed over the second insulating film to thereby form a second interconnection electrically connected to the first interconnection via the first through hole;

(g) a step of forming a third insulating film over the second interconnection, thereafter defining a second through hole in the third insulating film provided over each information storage capacitive element and defining a third through hole in the third insulating film provided over the second interconnection; and (h) a step of patterning a fourth conductive film formed over the third insulating film to thereby form a feeding interconnection electrically connected to the upper electrode of each information storage capacitive element via the second through hole, and a third interconnection electrically connected to the second interconnection via the third through hole.

(2) In the method of manufacturing the semiconductor integrated circuit device according to the present invention as described above, the third insulating film formed over the second interconnection includes an insulating film formed by a high-density plasma CVD method, and the second insulating film formed over the information storage capacitive element excludes the insulating film formed by the high-density plasma CVD method.

Typical ones of various aspects of the present invention have been described in brief. However, various features of the present application and specific configurations thereof will be better understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 11 is a fragmentary cross-sectional view of the semiconductor substrate, showing a step of the method of manufacturing the DRAM according to one embodiment of the present invention;

FIG. 12 is a fragmentary cross-sectional view of the semiconductor substrate, depicting a step of the method of manufacturing the DRAM according to one embodiment of the present invention;

FIG. 13 is a fragmentary cross-sectional view of the semiconductor substrate, showing a step of the method of manufacturing the DRAM according to one embodiment of the present invention;

FIG. 14 a fragmentary cross-sectional view of the semiconductor substrate, illustrating a step of the method of manufacturing the DRAM according to one embodiment of the present invention;

DESCRIPTION OF THE PREFERRED EMBODIMENTS

Figure 1:
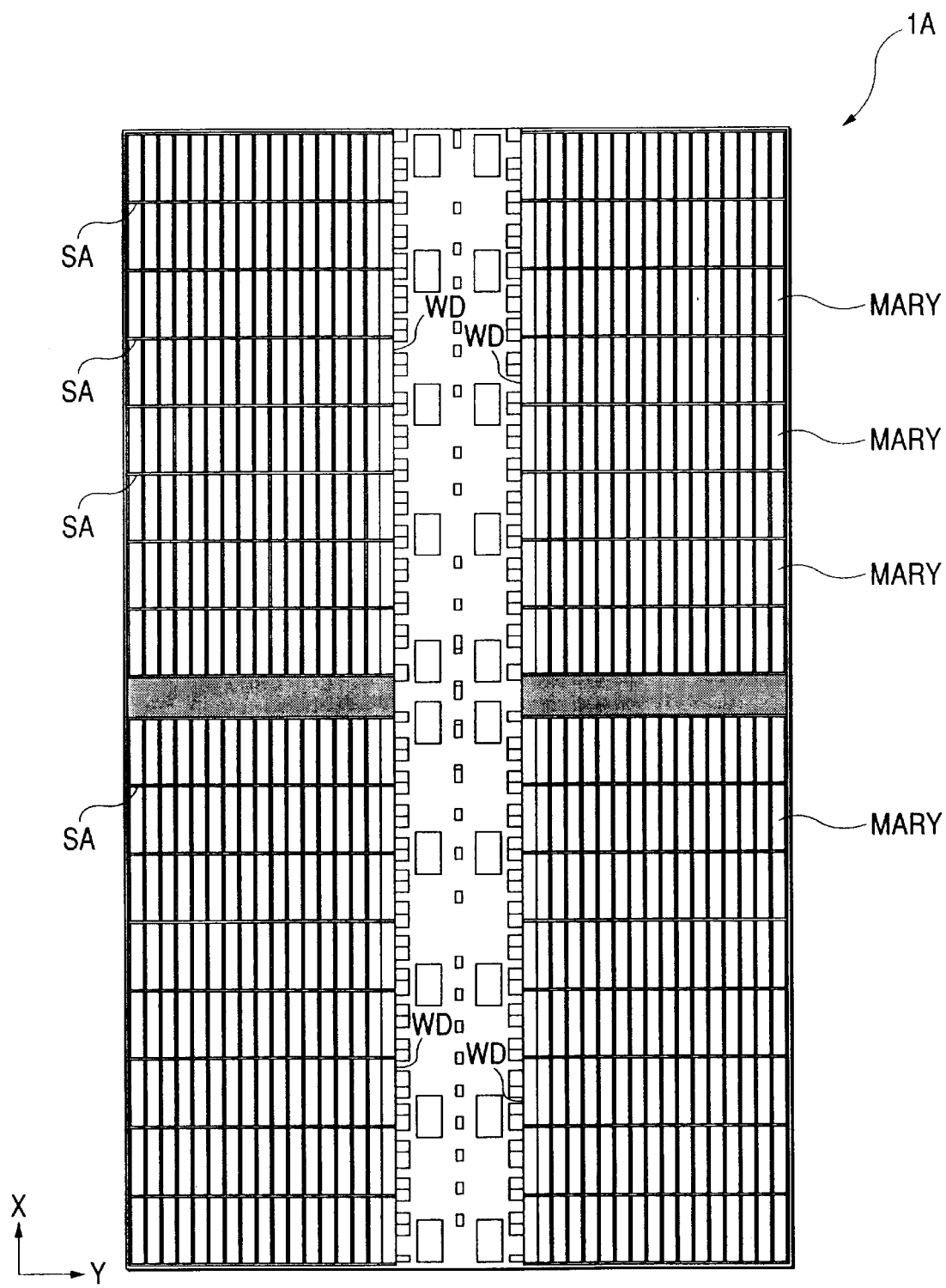
FIG. 1 is an overall plan view showing a semiconductor chip on which a DRAM according to an embodiment 1 of the present invention is formed.

Preferred embodiments of the present invention will hereinafter be described in detail with reference to the accompanying drawings. In all the drawings for describing the embodiments, components or members having the same function are identified by the same reference numerals and their repetitive description will be omitted.

FIG. 1 is an overall plan view of a semiconductor chip over which a DRAM according to the present embodiment is formed. As shown in the drawing, a large number of memory arrays MARY are disposed over a main or principal surface of a semiconductor chip 1A comprised of monocrystal silicon in matrix form along an X direction (corresponding to the longitudinal direction of the semiconductor chip 1A) and a Y direction (corresponding to the transverse direction of the semiconductor chip 1A). Sense amplifiers SA are disposed between the memory arrays MARY disposed adjacent to one another along the X direction. Word drivers WD, control circuits such as data line selection circuits, etc., input/output circuits, bonding pads, etc. are disposed in the central portion of the main surface of the semiconductor chip 1A.

Figure 2:
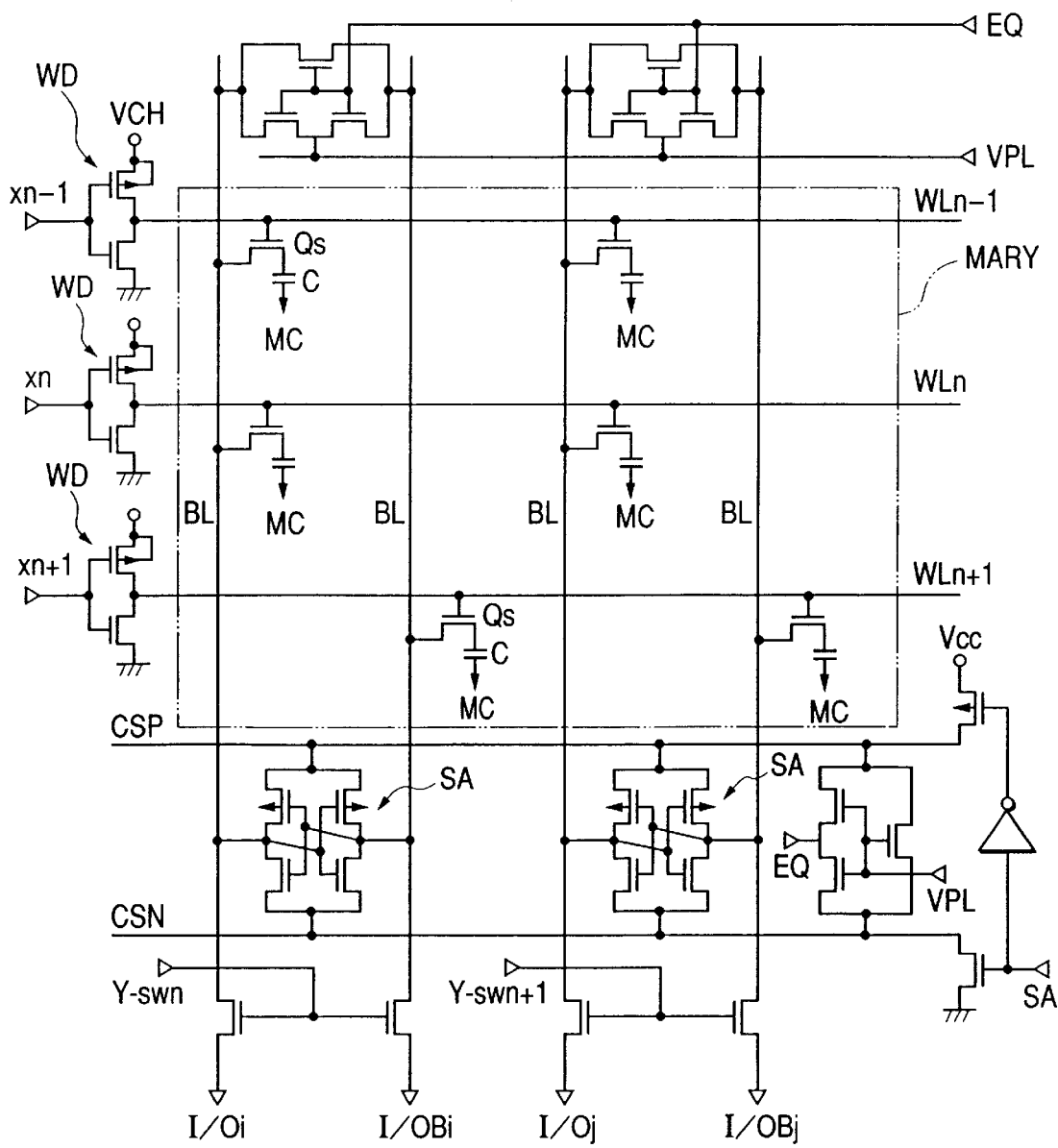
FIG. 2 is an equivalent circuit diagram of the DRAM according to the embodiment 1 of the present invention.

FIG. 2 is an equivalent circuit diagram of the DRAM. As shown in the drawing, each of the memory arrays (MARY) of the DRAM comprises a plurality of word lines WL (WLn−1, WLn, WLn+1, . . .) and a plurality of bit lines BL disposed in matrix form, and a plurality of memory cells (MC) respectively placed at points where the word lines WL and the bit lines BL intersect. Each memory cell, which stores on-bit information therein, comprises one information storage capacitive element C and one memory cell selection MISFET Qs electrically series-connected thereto. One of the source and drain of each memory cell selection MISFET Qs is electrically connected to the information storage capacitive element C and the other thereof is electrically connected to its corresponding bit line BL. One end of each word line WL is electrically connected to its corresponding word driver WD and one end of each bit line BL is electrically connected to its corresponding sense amplifier SA.

Figure 3:
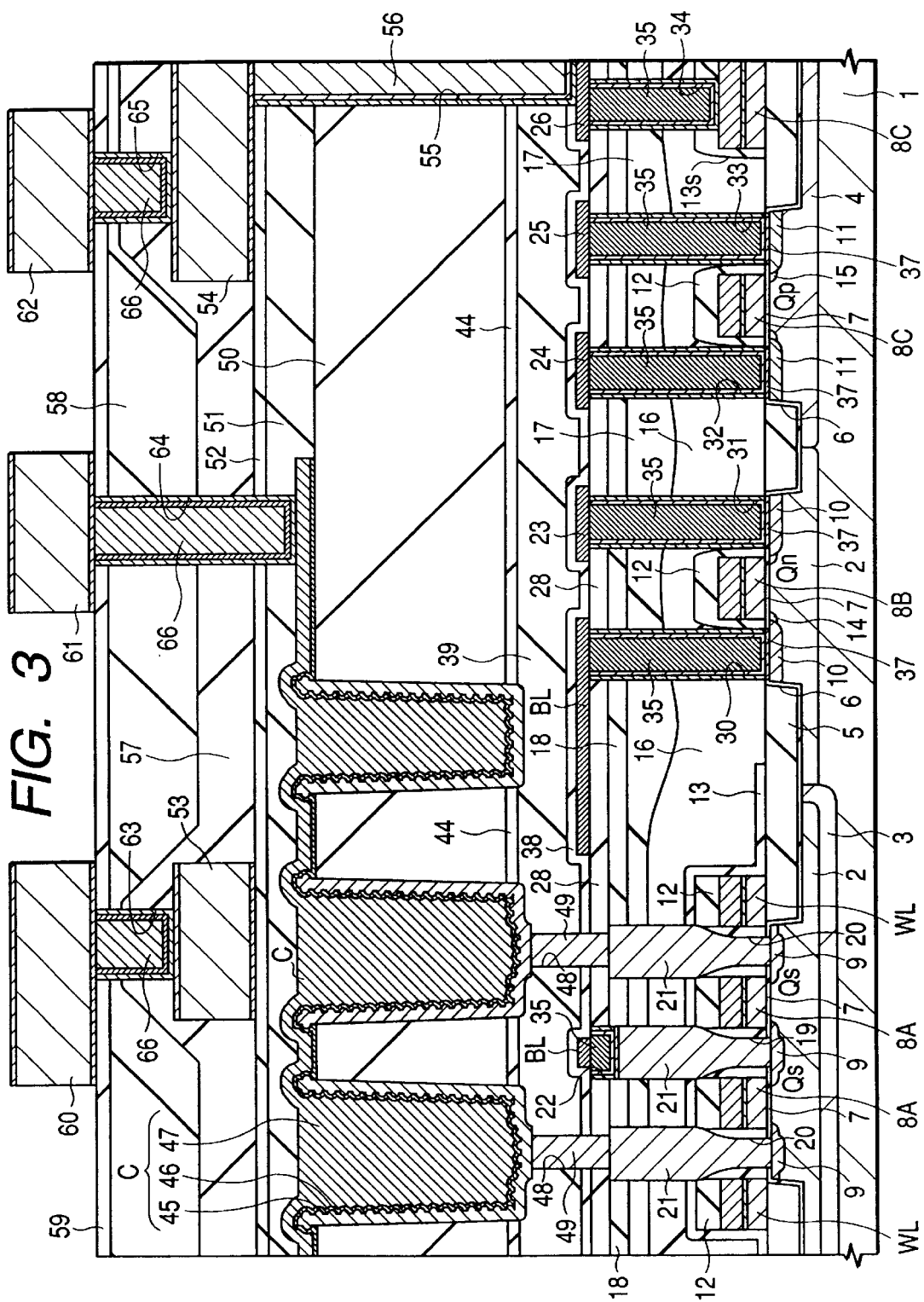
FIG. 3 is a fragmentary cross-sectional view of a semiconductor substrate, showing respective parts of a memory array and a peripheral circuit of a DRAM according to one embodiment of the present invention.
Figure 4:
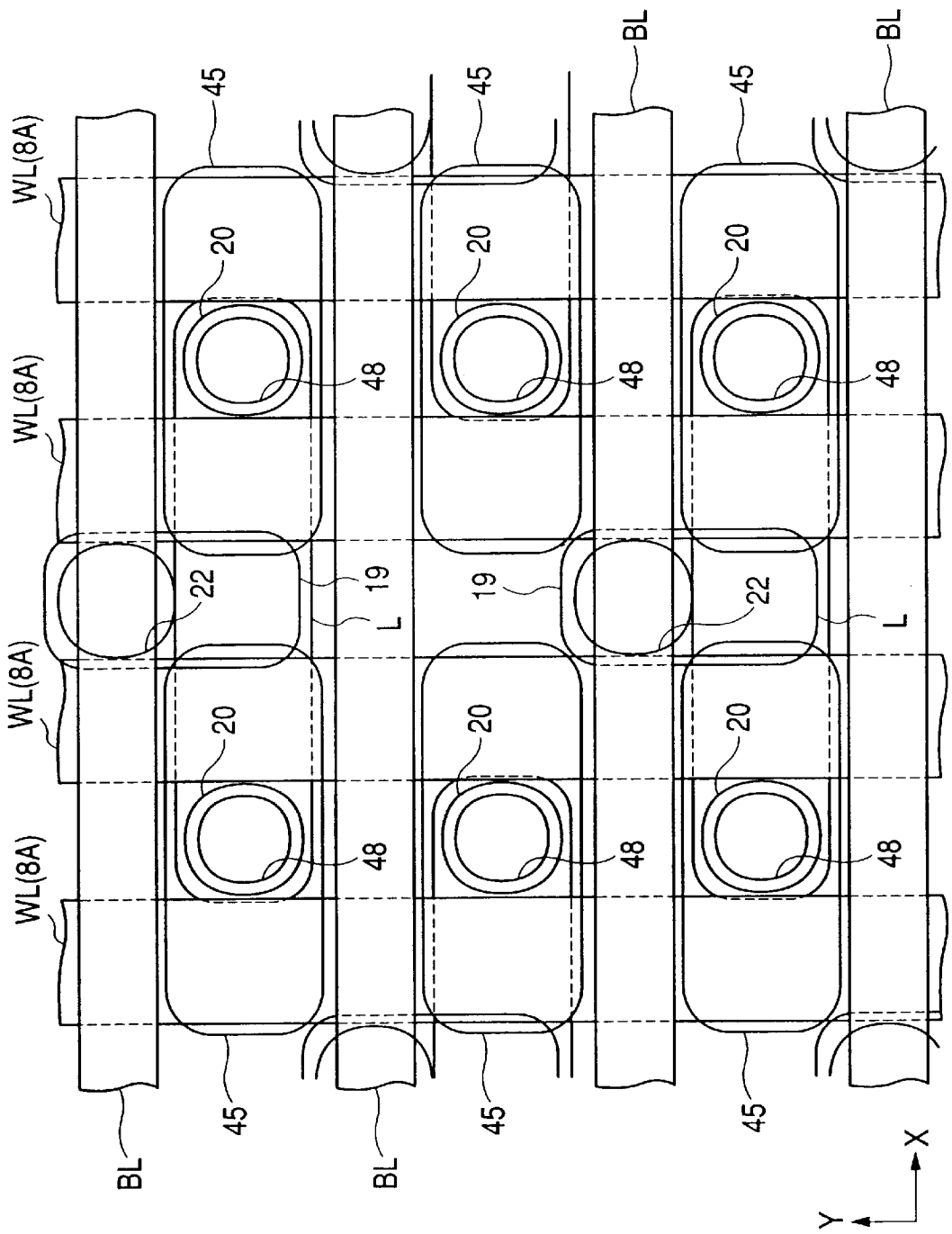
FIG. 4 is a fragmentary plan view of a semiconductor substrate, showing part of the memory array of the DRAM according to one embodiment of the present invention.

FIG. 3 is a fragmentary cross-sectional view of a semiconductor substrate, showing respective parts of a memory array and a peripheral circuit of a DRAM. FIG. 4 is a schematic plan view of the semiconductor substrate, showing part of each memory array. Incidentally, FIG. 4 shows only conductive layers (except for plate electrodes) which constitute each individual memory cell. Each insulating film provided between the conductive layers and a metal wire or interconnections disposed over each plate electrode are omitted from the drawing.

Each memory cell of the DRAM is formed in a p-type well 2 formed over the principal surface of a semiconductor substrate 1 comprised of p-type monocrystal silicon. In order to prevent noise from entering from the input/output circuit or the like formed in the other region of the semiconductor substrate 1, the p-type well 2 lying in an area or region (memory array) in which each memory cell is formed, is electrically separated from the semiconductor substrate 1 by an n-type semiconductor region 3.

The memory cell is made up of a stacked structure wherein each information storage capacitive element C is placed above its corresponding memory cell selection MISFET Qs. The memory cell selection MISFET Qs is comprised of an n channel MISFET and is formed in each active region L of the p-type well 2. The active regions L are shaped in a slender island-shaped pattern extending straightforward along the X direction in FIG. 4. The two memory cell selection MISFETs Qs, which share one (n-type semiconductor region 9) of the source and drain with each other, are formed in their corresponding active regions L so as to be disposed adjacent to each other in the X direction.

A device separation region, which surrounds each active region L, is defined or constructed by a device separation groove 6 formed by embedding a silicon oxide film 5 into shallow grooves defined in the p-type well 2. The silicon oxide film 5 embedded in the device separation groove 6 is flattened so that its surface takes substantially the same height as the surfaces of the active regions L. Since no bird's beak is formed at the end of each active region L, the device separation region constructed by such a device separation groove 6 increases in effective area as compared with each device separation region (field oxide film) having the same size, which is formed by a LOCOS (localized oxidation) method.

Each memory cell selection MISFET Qs is composed principally of a gate oxide film 7, a gate electrode 8A and a pair of n-type semiconductor regions 9 constituting the source and drain. The gate electrodes 8A are formed integrally with their corresponding word lines WL and linearly extend with the same widths and spaces along the Y direction. The gate electrode 8A (each word line WL) has a polymetal structure constructed of a low-resistance polycrystalline silicon film doped with an n-type impurity such as P (phosphorous), a barrier metal layer composed of a WN (tungsten nitride) film or the like, which is formed over the low-resistance polycrystalline silicon film, and a high-melting metal film such as a W (tungsten) film, which is formed over the barrier metal layer. Since each gate electrode 8A having a polymetal structure is lower in electrical resistance than a gate electrode composed of a polycrystal silicon film or polysilicide film, it is possible to reduce the signal delay developed in each word line.

Each of the peripheral circuits of the DRAM comprises an n channel MISFET Qn and a p channel MISFET Qp. The n channel MISFET Qn is formed in the p-type well 2 and is composed principally of a gate oxide film 7, a gate electrode 8B and a pair of $n^+$-type semiconductor regions 10 constituting a source and a drain. Further, the p channel MISFET Qp is formed in an n-type well 4 and is composed principally of a gate oxide film 7, a gate electrode 8C and a pair of $p^+$-type semiconductor regions 11 constituting a source and a drain. The gate electrodes 8B and 8C are respectively formed of the same polymetal structure as that for the gate electrode 8A (word line WL). The n channel MISFET Qn and the p channel MISFET Qp constituting each peripheral circuit are fabricated in accordance with a design rule which is reduced as compared with the memory cell.

A silicon nitride film 12 is formed at a portion above the gate electrode 8A (word line WL) of each memory cell selection MISFET Qs. A silicon nitride film 13 is formed over the silicon nitride film 12 and over the side walls thereof and the side walls of the gate electrodes 8A (word lines WL). Silicon nitride films 12 are formed over the gate electrodes 8B and 8C of the MISFETs of the peripheral circuit. Further, side wall spacers 13s each composed of the silicon nitride film 13 are formed over the side walls of the gate electrodes 8B and 8C.

As will be described later, the silicon nitride film 12 and silicon nitride film 13 of the memory array are used as etching stoppers utilized upon defining contact holes in portions above the source and drain (n-type semiconductor regions 9) of each memory cell selection MISFET Qs on a self-aligned basis. Further, the side wall spacers 13s of the peripheral circuit are used to bring the source and drain of each n channel MISFET Qn and the source and drain of each p channel MISFET Qs to LDD (Lightly Doped Drain) structures.

An SOG film 16 is formed over the memory cell selection MISFETs Qs, n channel MISFETs Qn and p channel MISFETs Qp. Further, silicon oxide films 17 and 18 corresponding to two layers are formed over the SOG film 16. The surface of the upper-layer silicon oxide film 18 is flattened so as to take substantially the same height over the whole area of the semiconductor substrate 1.

Contact holes 19 and 20, which extend through the silicon oxide films 18 and 17 and the SOG film 16, are defined in the portions above the pair of n-type semiconductor regions 9 constituting the source and drain of each memory cell selection MISFET Qs. Plugs 21 each composed of a polycrystal silicon film having low resistance, which is doped with the n-type impurity (e.g., P (phosphorous)), are embedded inside these contact holes 19 and 20.

Each of the diameters in the X direction of the bottoms of the contact holes 19 and 20 is defined according to a space defined between the silicon nitride film 13 on the side wall of one of the opposed two gate electrodes 8A (word lines WL) and the silicon nitride film 13 on the side wall of the other thereof. Namely, the contact holes 19 and 20 are formed in self-alignment with the gate electrodes 8A (word lines WL).

As shown in FIG. 4, the diameter in the Y direction, of one contact hole 20 of the pair of contact holes 19 and 20 is substantially identical to the size in the Y direction of each active region L. On the other hand, the diameter in the Y direction of the other contact hole 19 (corresponding to the contact hole over the n-type semiconductor region 9 shared between the two memory cell selection MISFETs Qs) is larger than the size in the Y direction of the active region L. Namely, each contact hole 19 is shaped in a substantially rectangular plan pattern in which the diameter in the Y direction is larger than the diameter in the X direction. Some fall outside the active regions L and extend over the device separation groove 6. Owing to the formation of the contact holes 19 in such patterns, it is unnecessary to partly make the width of each bit line BL thick so as to extend up to the portion above the active region L and to extend part of each active region L in the direction of the bit line BL when the bit line BL and the n-type semiconductor region 9 are electrically connected to each other through the contact hole 19. It is therefore possible to reduce the size of each memory cell.

A silicon oxide film 28 is formed over the silicon oxide film 18. Through holes 22 are defined in the silicon oxide films 28 provided over the contact holes 19. Plugs 35 each comprised of a conductive film obtained by stacking a Ti (Titanium) film, a TiN (titanium nitride) film and a W film on one another in order from the lower layer are embedded inside the through holes 22. TiSi$_2$ (titanium silicide) layers 37 produced by reaction between the Ti films constituting parts of the plugs 35 and the polycrystal silicon films constituting the plugs 21 are respectively formed at interfaces between the plugs 35 and the plugs 21 embedded in the contact holes 19 placed below the through holes 22. The through holes 22 are disposed above the device separation groove 6 out of the active regions L.

Each bit line BL is formed over the silicon oxide film 28. The bit lines BL are disposed above the device separation groove 6 and linearly extend along the X direction with the same width and space. The bit line BL is made up of the W film and is electrically connected to one (corresponding to the n-type semiconductor region 9 shared between the two memory cell selection MISFETs Qs) of the source and drain of each memory cell selection MISFET Qs via the through hole 22 defined in each silicon oxide film 28 and the contact hole 19 defined in its lower insulating films (silicon oxide films 28, 18, 17, SOG film 16 and gate oxide film 7). Since each bit line BL can be reduced in sheet resistance by constructing the bit line BL of a metal (W), the reading and writing of information can be performed at high speed. Since the bit lines BL and wires or interconnections 23 through 26 of the peripheral circuit, which are to be described later, can be simultaneously formed with the same process, it is possible to simplify a process for manufacturing the DRAM. Owing to the formation of each bit line BL of a metal (W) high in heat resistance and electromigration resistance, each bit line BL cab be prevented from breaking even when the width of the bit line BL is miniaturized.

The interconnections 23 through 26 corresponding to the first wiring layer are formed over the silicon oxide film 28 of the peripheral circuit. These interconnections 23 through 26 are made up of the same conductive material (W) as that for the bit line BL and are formed simultaneously in a process for forming each bit line BL as will be described later. The interconnections 23 through 26 are respectively electrically connected to MISFETs (n channel MISFETs Qn and p channel MISFETS Qp) of the peripheral circuit through contact holes 30 through 34 defined in the silicon oxide films 28, 18, 17 and SOG film 16.

The plugs 35 each comprised of the conductive film obtained by laminating the Ti (Titanium) film, the TiN (titanium nitride) film and the W film on one another in order from the lower layer are embedded inside the contact holes 30 through 34 for connecting the MISFETs of the peripheral circuit and the interconnections 23 through 26. The TiSi$_2$ layers 37 produced by reaction between the Ti films constituting parts of the plugs 35 and the semiconductor substrate 1(Si) are respectively provided at the bottoms of the contact holes (30 through 33) of these contact holes 30 through 34, which are defined in their corresponding portions above the sources and drains (n$^+$-type semiconductor regions 10 and p$^+$-type semiconductor regions 11) of the MISFETs of the peripheral circuit, whereby the contact resistances between the plugs 35 and the sources and drains (n$^+$-type semiconductor regions 10 and p$^+$-type semiconductor regions 11) can be reduced.

Silicon oxide films 38 and 39 are respectively formed over the bit lines BL and the interconnections 23 through 26 corresponding to the first wiring layer. The upper silicon oxide film 39 is flattened so that the surface thereof takes the same height over the entire area of the semiconductor substrate 1.

A silicon nitride film 44 is formed over the silicon oxide film 39 of the memory array. Each information storage capacitive element C is further formed over the silicon nitride film 44. The information storage capacitive element C is made up of a lower electrode (storage electrode) 45, an upper electrode (plate electrode) 47 and a Ta$_2$O$_5$ (tantalum oxide) film (dielectric film) 46 provided between those electrodes. The lower electrode 45 is composed of a low-resistance polycrystal silicon film doped with P (phosphorous), for example, whereas the upper electrode 47 is composed of a TiN film, for example.

The lower electrode 45 of each information storage capacitive element C is formed in a slender pattern straightforward along the x direction of FIG. 4. Each lower electrode 45 is electrically connected to the plug 21 defined in the contact hole 20 through a plug 49 embedded in a through hole 49 extending through the silicon nitride film 44 and the silicon oxide films 39, 38 and 28 used as the lower layers. Further, the lower electrode 45 is electrically connected to the other (n-type semiconductor region 9) of the source and drain of each memory cell selection MISFET Qs through the plug 21. The plug 49 composed of a low-resistance polycrystal silicon film doped with P (phosphorous), for example, is embedded inside each through hole 48 defined between the lower electrode 45 and the contact hole 20.

A silicon oxide film 50 having a film thickness corresponding to substantially the same height as the lower electrode 45 of each information storage capacitive element C is formed above the silicon oxide film 39 of the peripheral circuit. Owing to the formation of the silicon oxide film 50 of the peripheral circuit with such a large film thickness, the surface of a silicon oxide film 51 formed over the information storage capacitive element C takes substantially the same height at the memory array and the peripheral circuit.

Therefore, a grounding step-like offset or difference between interconnections 53 and 54 corresponding to a second wiring layer, which are provided at a layer above the silicon oxide film 51, can be reduced.

Silicon oxide films 51 and 52 corresponding to two layers are formed over each information storage capacitive element C. Further, the interconnections 53 and 54 corresponding to the second wiring layer are formed over the silicon oxide films 51 and 52. The interconnections 53 and 54 corresponding to the second wiring layer are respectively comprised of a conductive layer with an Al (Aluminum) alloy as a principal part. The interconnection 54 corresponding to the second wiring layer formed in the peripheral circuit is electrically connected to the interconnection 26 of the first wiring layer through a through hole 55 having a large aspect ratio, which is defined in insulating films (silicon oxide films 52, 51, 50, silicon nitride film 44 and silicon oxide films 39 and 38) provided at a layer below the interconnection 54. A plug 56 comprised of, for example, the Ti film, TiN film and W film is embedded into the through hole 55.

Silicon oxide films 57, 58 and 59 corresponding to three layers are formed over the interconnections 53 and 54 corresponding to the second wiring layer. Of the silicon oxide films 57, 58 and 59 corresponding to the three layers, the silicon oxide film 57 corresponding to the lower layer is formed by a high density plasma CVD method which has an excellent gap-filling characteristic. The silicon oxide film 58 provided over the silicon oxide film 57 is flattened so that the surface thereof is brought to substantially the same height over the entire area of the semiconductor substrate 1.

Wires or interconnections 60, 61 and 62 corresponding to a third wiring layer are formed over the silicon oxide film 59. The interconnections 60, 61 and 62 corresponding to the third wiring layer are composed of a conductive film with Al alloy as the principal part in a manner similar to the interconnections 53 and 54 corresponding to the second wiring layer.

Of the interconnections 60, 61 and 62 corresponding to the third wiring layer, the interconnection 60 corresponding to the third wiring layer formed in the memory array is electrically connected to its corresponding interconnection 53 of the second wiring layer via a through hole 63 defined in the silicon oxide films 59, 58 and 57 placed in the layer below the interconnection 60. Further, the interconnection 61 is electrically connected to its corresponding upper electrode 47 of each information storage capacitive element C via a through hole 64 defined in the silicon oxide films 59, 58, 57, 52 and 51 placed in the layer below the interconnection 61. Namely, the interconnection 61 makes up a power-supply or feeding interconnection for supplying a predetermined source or power(e.g., ½ Vcc) to the upper electrode 47 of each information storage capacitive element C.

The interconnection 62 corresponding to the third wiring layer formed in a peripheral circuit region is electrically connected to its corresponding interconnection 54 of the second wiring layer via a through hole 65 defined in the silicon oxide films 59, 58 and 57 placed in the layer therebelow. Plugs 66 each comprised of, for example, the Ti film, TiN film and W film are embedded inside their corresponding through holes 63 through 65.

One example of a method of manufacturing the DRAM constructed in the above-described manner will next be described in process order with reference to FIGS. 5 through 42.

Figure 5:
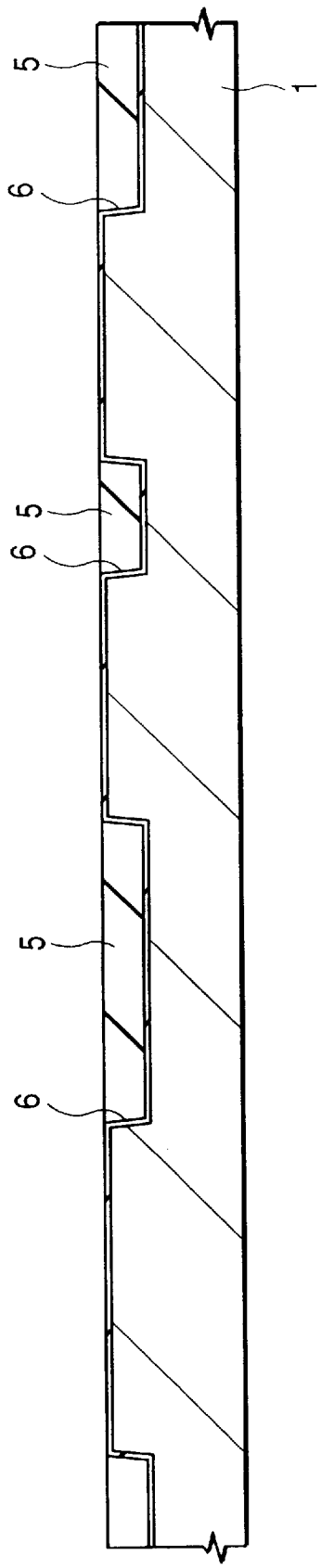
FIG. 5 is a fragmentary cross-sectional view of a semiconductor substrate, illustrating a step in the method of manufacturing a DRAM according to one embodiment of the present invention.
Figure 7:
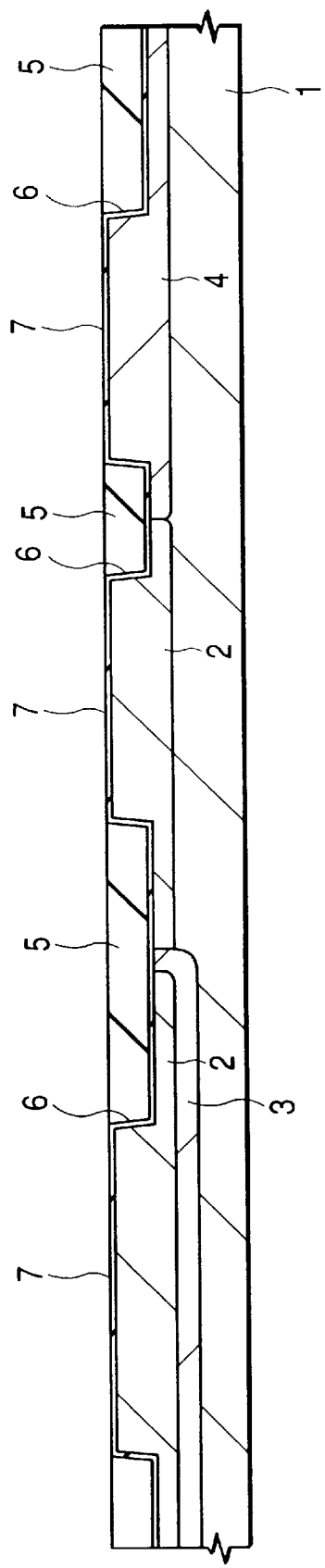
FIG. 7 is a fragmentary cross-sectional view of the semiconductor substrate, depicting a step in the method of manufacturing the DRAM according to one embodiment of the present invention.
Figure 6:
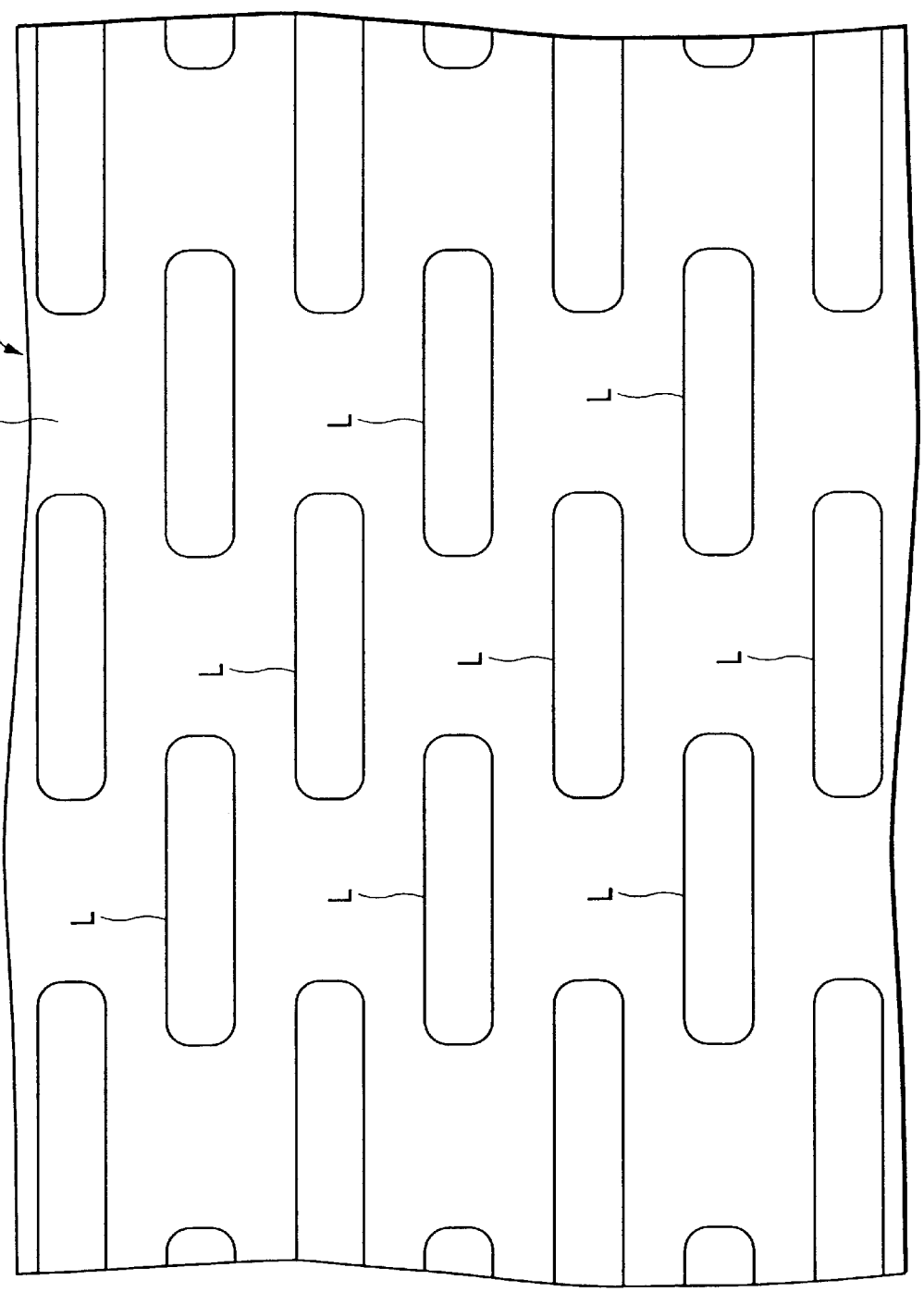
FIG. 6 is a fragmentary plan view of the semiconductor substrate, showing a step in the method of manufacturing the DRAM according to one embodiment of the present invention.

As shown in FIG. 5, a device separation groove 6 is defined in a device separation region of a main or principal surface of a semiconductor substrate 1 comprised of monocrystal silicon which is of a p type and whose resistivity is about 10 Ω/cm. The device separation groove 6 is formed as follows. The surface of the semiconductor substrate 1 is etched to define a groove having a depth which ranges from about 300 to 400 nm. Next, a silicon oxide film 5 is deposited over the semiconductor substrate 1 including the groove by the CVD method. Afterwards, the silicon oxide film 5 is polished back and formed by a chemical mechanical polishing (CMP) method. The silicon oxide film 5 is flattened so that the surface thereof takes substantially the same height as that of each active region. Owing to the definition of the device separation groove 6, active regions L having slender island-shaped patterns surrounded by the device separation groove 6 are simultaneously formed in the region (memory array) for forming each memory cell as shown in FIG. 6. Unillustrated active regions surrounded by the device separation groove 6 are simultaneously formed even in the region for forming the peripheral circuit.

Next, an n-type impurity, e.g., P (phosphorous) is ion-implanted in the semiconductor substrate 1 of the memory array to form an n-type semiconductor region 3. Thereafter, a p-type impurity, e.g., B (boron) is ion-implanted in part (region for forming each n channel MISFET Qn) of the peripheral circuit of the memory array to form a p-type well 2. Further, the n-type impurity, e.g., P (phosphorous) is ion-implanted in the other part (region for forming each p channel MISET Qp) of the peripheral circuit to form an n-type well 4.

Subsequently, an impurity for controlling or adjusting the threshold voltage of each MISFET, e.g., $BF_2$ (boron fluoride) is ion-implanted in the p-type well 2 and n-type well 4. Next, the surfaces of the p-type well 2 and n-type well 4 are cleaned with cleaning fluid of HF (hydrofluoric acid). Thereafter, the semiconductor substrate 1 is subjected to wet oxidation to thereby form a clean gate oxide film 7 over the p-type well 2 and n-type well 4.

Figure 8:
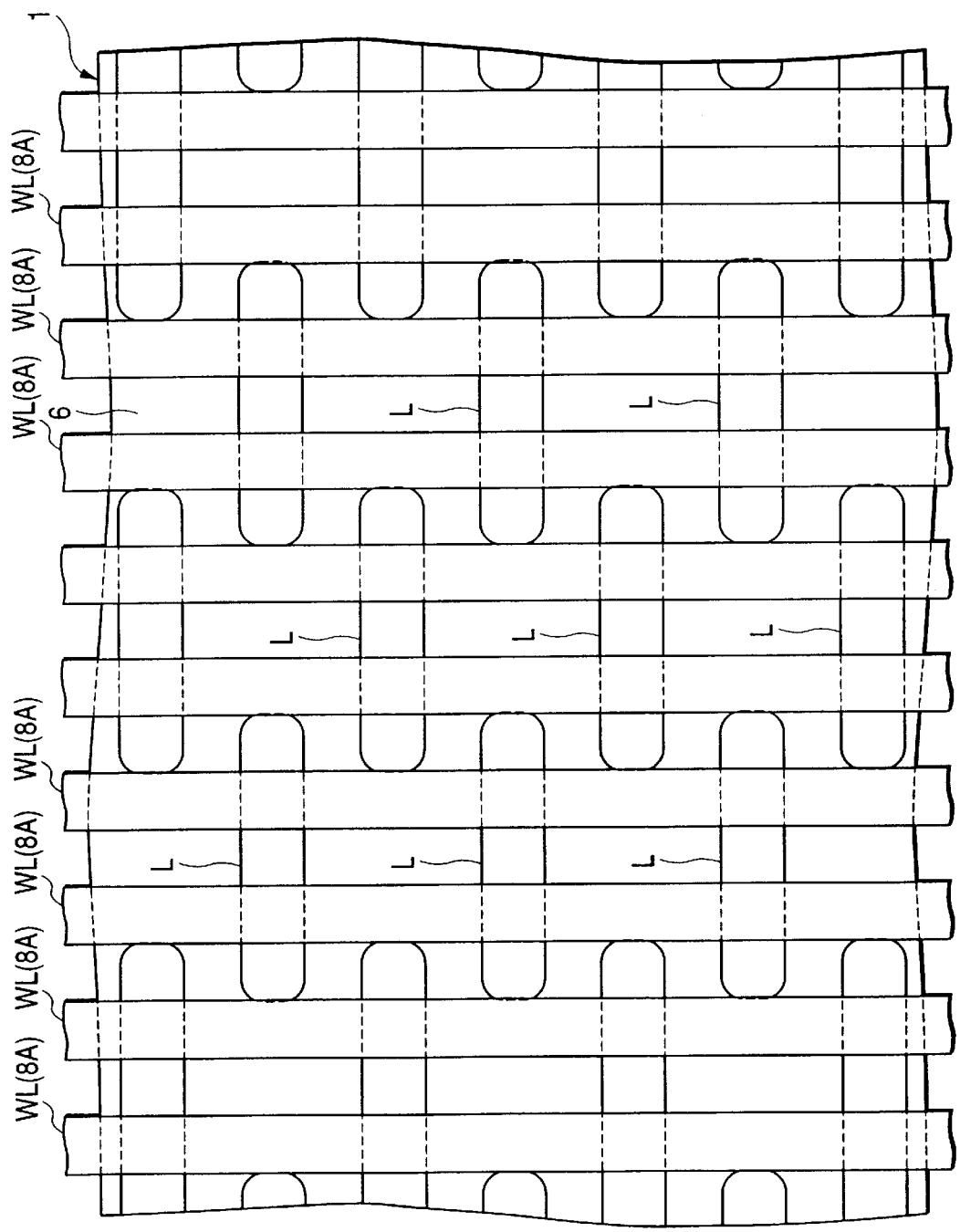
FIG. 8 is a fragmentary plan view of the semiconductor substrate, showing a step of the method of manufacturing the DRAM according to one embodiment of the present invention.
Figure 9:
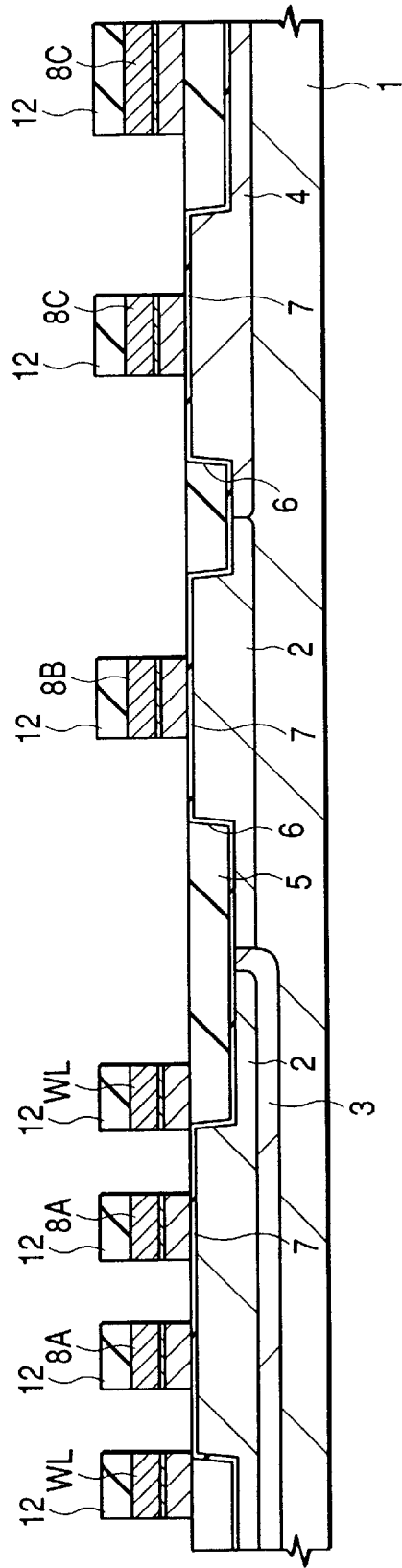
FIG. 9 is a fragmentary cross-sectional view of the semiconductor substrate, showing a step of the method of manufacturing the DRAM according to one embodiment of the present invention.

Next, gate electrodes 8A (word lines WL) and gate electrodes 8B and 8C are formed over the gate oxide film 7 as shown in FIGS. 8 and 9. The gate electrodes 8A (word lines WL) and the gate electrodes 8B and 8C are formed by depositing a polycrystal silicon film doped with the n-type impurity such as P (phosphorous) over the semiconductor substrate 1 by the CVD method, followed by depositing a WN (tungsten nitride) film and a W film over the polycrystal silicon film by sputtering, depositing a silicon nitride film 12 over the WN film and W film by the CVD method, and thereafter patterning these films with a photoresist film as a mask. The WN film serves as a barrier layer for preventing the formation of a high-resistance silicide layer at the interface between the W film and the polycrystal silicon film by the reaction between the W film and the polycrystal silicon film upon high-temperature heat treatment. A WN-film high-melting point metal nitride film, e.g., TiN (titanium nitride) film may be used for the barrier layer. Since the gate electrode 8A (word line WL) having a polymetal structure, which is comprised principally of the high-melting point metal film and the polycrystal silicon film, is low in electrical resistance as compared with a gate electrode composed of a polycrystal silicon film and a polysilicide film (corresponding to a film obtained by stacking a high-melting point metal silicide film and a polycrystal silicon film on each other), it is possible to reduce signal delay developed in each word line.

Figure 10:
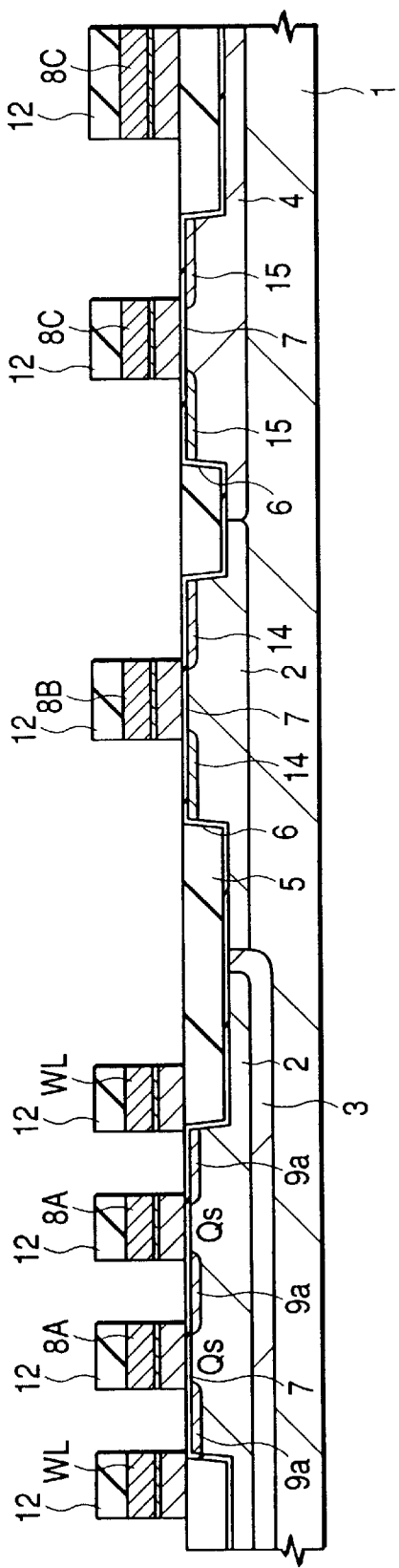
FIG. 10 is a fragmentary cross-sectional view of the semiconductor substrate, illustrating a step of the method of manufacturing the DRAM according to one embodiment of the present invention.

Next, the p-type impurity such as B (boron) is ion-implanted in the n-type well 4 to form p⁻-type semiconductor regions 15 in the n-type well 4 on both sides of each gate electrode 8C as shown in FIG. 10. Further, the n-type impurity, e.g., P (phosphorous) is ion-implanted in the p-type well 2 to form n⁻-type semiconductor regions 9a in the p-type well 2 on both sides of each gate electrode 8B and to form n⁻-type semiconductor regions 14 in the p-type well 2 on both sides of each gate electrode 8B. Each memory cell selection MISFET Qs is substantially completed according to the process steps used so far.

Next, as shown in FIG. 11, a silicon nitride film 13 is deposited over the semiconductor substrate 1 by the CVD method and thereafter the silicon nitride film 13 of the memory array is covered with a photoresist film (not shown). Further, the silicon nitride film 13 of the peripheral circuit is subjected to anisotropic etching, whereby sidewall spacers 13s are respectively formed over the side walls of the gate electrodes 8B and 8C of the peripheral circuit. This etching is performed using gas for etching the silicon nitride film 13 at a high selection ratio in order to minimize the amount of cutting of the silicon oxide film 5 embedded in the device separation groove 6 and the gate oxide film 7. In order to minimize the amount of cutting of the silicon nitride films 12 over the gate electrodes 8B and 8C, the amount of overetching is allowed to remain fixed to the required minimum.

Next, as shown in FIG. 12, the p-type impurity, e.g., B (boron) is ion-implanted in the n-type well 4 of the peripheral circuit to form p⁺-type semiconductor regions 11 (source and drain) of each p channel MISFET Qp. Further, an n-type impurity, e.g., As (arsenic) is ion-implanted in the p-type well 2 of the peripheral circuit to form n⁺-type semiconductor regions 10 (source and drain) of each n channel MISFET Qn. The p channel MISFET Qp and n channel MISFET Qn each having an LDD structure are substantially completed according to the process steps used so far.

Next, as shown in FIG. 13, an SOG film 16 is spin-applied onto the semiconductor substrate 1 and subjected to bake processing in an oxygen atmosphere containing water vapor at about 400° C., followed by heat treatment at 80° C. for about one minute, thereby densifying the SOG film 16. The SOG film 16 makes use of an inorganic SOG of polysilazane, for example. The SOG film 16 is high in reflow characteristic as compared with a glass flow film such as a BPSG film and is excellent in terms of a gap-filling characteristic of a micro space. Therefore, no void occurs even if the SOG film is embedded in a space of each gate electrode 8A (word line WL) miniaturized to the order of a resolution limit of photolithography. Since the SOG film 16 can obtain a high reflow characteristic even though a high-temperature and long-time heat treatment necessary for the BPSG film or the like is not performed, it is possible to restrain the diffusion of heat of the impurities implanted in the source and drain of each memory cell selection MISFET Qs and the source and drain of each MISFET (n channel MISFET Qn and p channel MISFET Qp) and thereby achieve a shallow junction. Since the SOC film can restrain the oxidation of the metal (W film) constituting the gate electrodes 8A (word lines WL) and gate electrodes 8B and 8C upon heat treatment, each memory cell selection MISFET Qs and each MISFET of the peripheral circuit can be enhanced in performance.

Next, a silicon oxide film 17 is deposited SOG film 16 as shown in FIG. 14. The silicon oxide film 17 is then polished by the CMP method to flatten the surface thereof, and a silicon oxide film 18 is deposited over the silicon oxide film 17. The silicon oxide films 17 and 18 are deposited by a plasma CVD method in which, for example, oxygen (or ozone) and tetra ethoxy silane (TEOS) are used for a source gas. The silicon oxide film 18 corresponding to the upper layer is deposited to mend or fix micro flaws on the surface of the silicon oxide film 17 corresponding to the lower layer, which are produced when it is polished by the CMP method.

Figure 15:
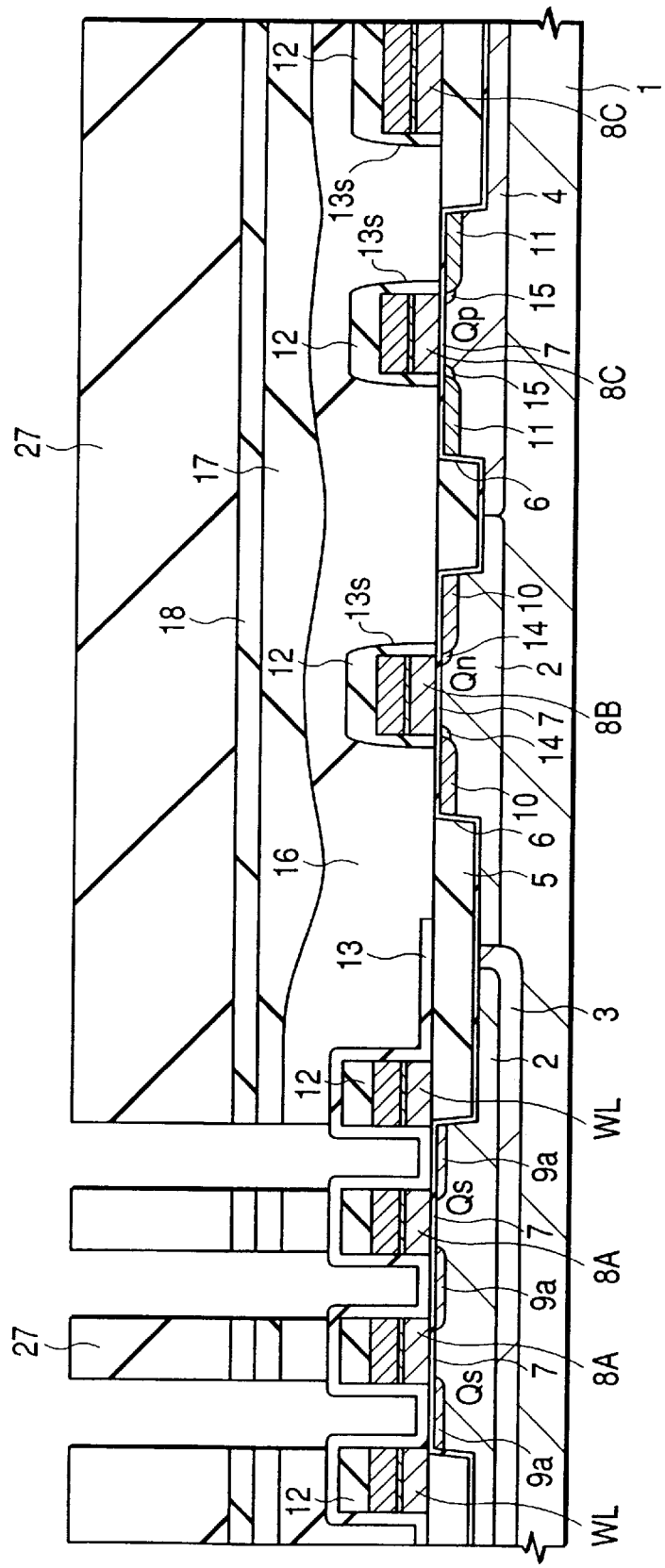
FIG. 15 is a fragmentary cross-sectional view of the semiconductor substrate, showing a step of the method of manufacturing the DRAM according to one embodiment of the present invention.

Next, as shown in FIG. 15, the silicon oxide films 18 and 17 over the n⁻-type semiconductor region (source and drain) of each memory cell selection MISFET Qs are removed by dry etching with the photoresist film 27 as a mask. This etching is performed using gas for etching the silicon oxide film 17 at a high selection ratio in order to prevent the silicon nitride film 13 placed in the layer below the silicon oxide film 17 from being removed.

Figure 16:
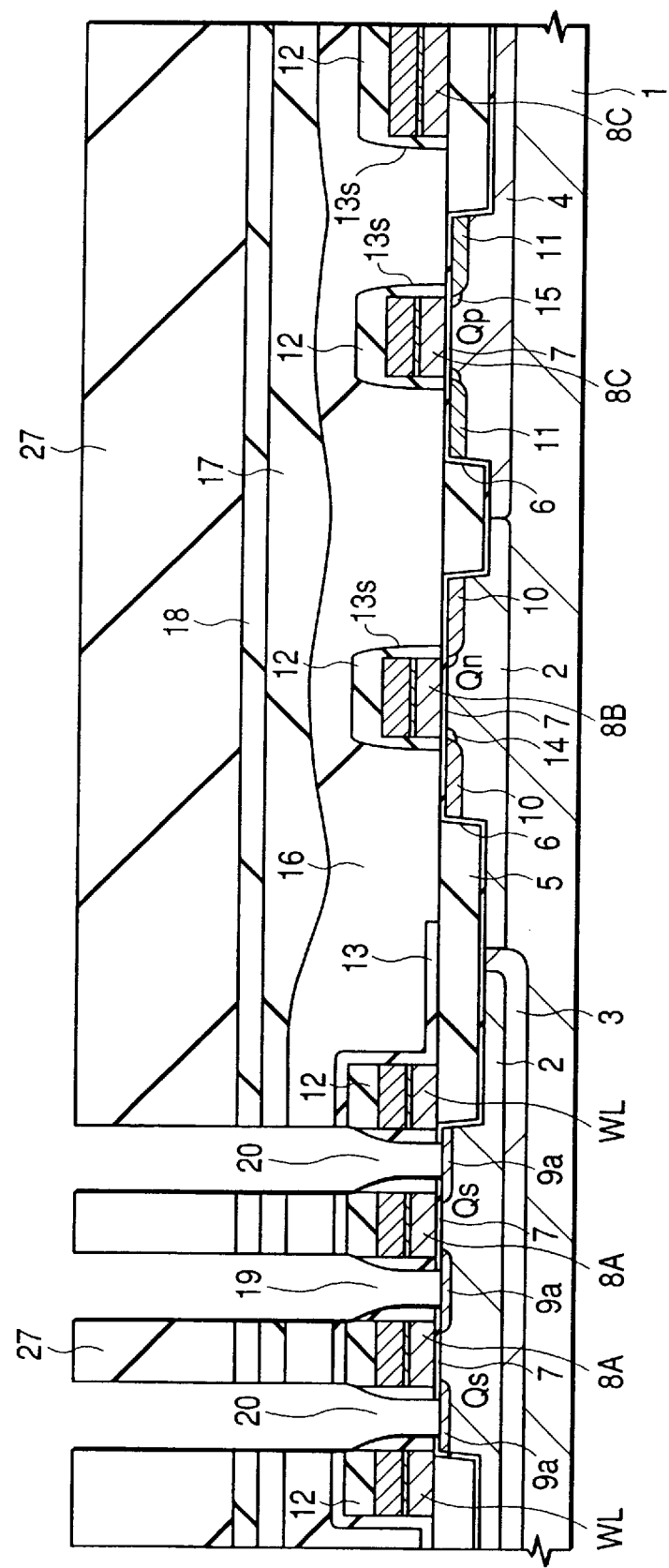
FIG. 16 is a fragmentary cross-sectional view of the semiconductor substrate, depicting a step of the method of manufacturing the DRAM according to one embodiment of the present invention.
Figure 17:
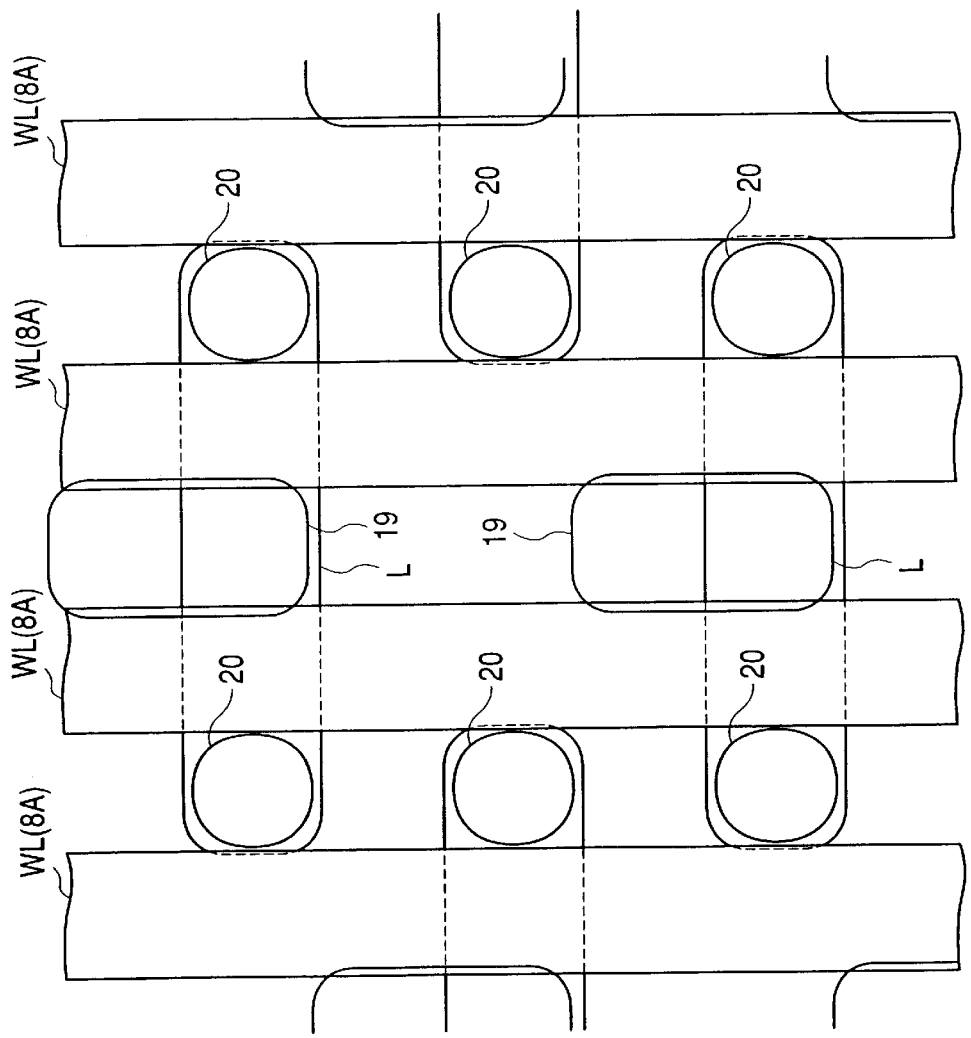
FIG. 17 a fragmentary plan view of the semiconductor substrate, showing a step of the method of manufacturing the DRAM according to one embodiment of the present invention.

Next, as shown in FIG. 16, the silicon nitride film 13 over the n⁻-type semiconductor regions (source and drain) 9a is removed by dry etching using the photoresist film 27 as the mask, followed by removal of the thin gate oxide film 7 placed in the layer below the silicon nitride film 13, whereby a contact hole 19 is defined above one of the n⁻-type semiconductor regions (source and drain) and contact holes 20 are defined above the others thereof. As shown in FIG. 17, each contact hole 19 (contact hole over the n-type semiconductor region 9 shared by the two memory cell selection MISFET Qs) is formed in such a slender pattern that the diameter thereof in the Y direction becomes about twice the diameter thereof in the X direction.

An n-type semiconductor layer may be formed in the p-type well 2 lying in the region deeper than the source and drain of each memory cell selection MISFET Qs by ion-implanting the n-type impurity (e.g. phosphorous) in the p-type well 2 through the contact holes 19 and 20 after the contact holes 19 and 20 have been defined. Since the n-type semiconductor layer has the effect of reducing electric fields which concentrate on the ends of the source and drain, leakage current at the ends of the source and drain can be reduced so as to improve a refresh characteristic of each memory cell.

The etching of the silicon nitride film 13 is performed using gas for etching the silicon nitride film 13 at a high selection ratio in order to minimize the amount of cutting of the semiconductor substrate 1 and the device separation groove 6. Further, the present etching is done under such a condition as to anisotropically etch the silicon nitride film 13 and the silicon nitride film 13 is left on each side wall of the gate electrode 8A (word line WL). Thus, the minute contact holes 19 and 20 whose X-direction diameters are less than or equal to the resolution limit of the photolithography, can be formed in self-alignment with the gate electrodes 8A (word lines WL).

Figure 18:
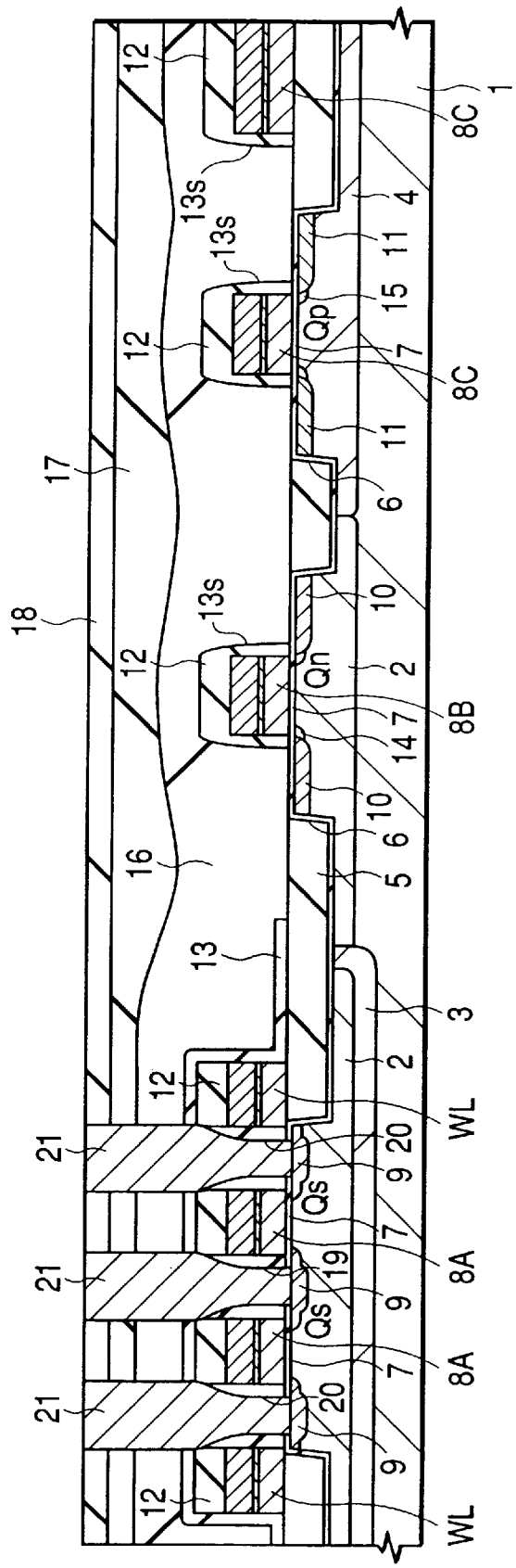
FIG. 18 is a fragmentary cross-sectional view of the semiconductor substrate, illustrating a step of the method of manufacturing the DRAM according to one embodiment of the present invention.

Next, plugs 21 are formed inside the contact holes 19 and 20 as shown in FIG. 18. The plugs 21 are formed by depositing a polycrystal silicon film doped with the n-type impurity (e.g., As (Arsenic)) over the silicon oxide film 18 by the CVD method and thereafter polishing the polycrystal silicon film by the CMP method to thereby leave it inside the contact holes 19 and 20.

Figure 19:
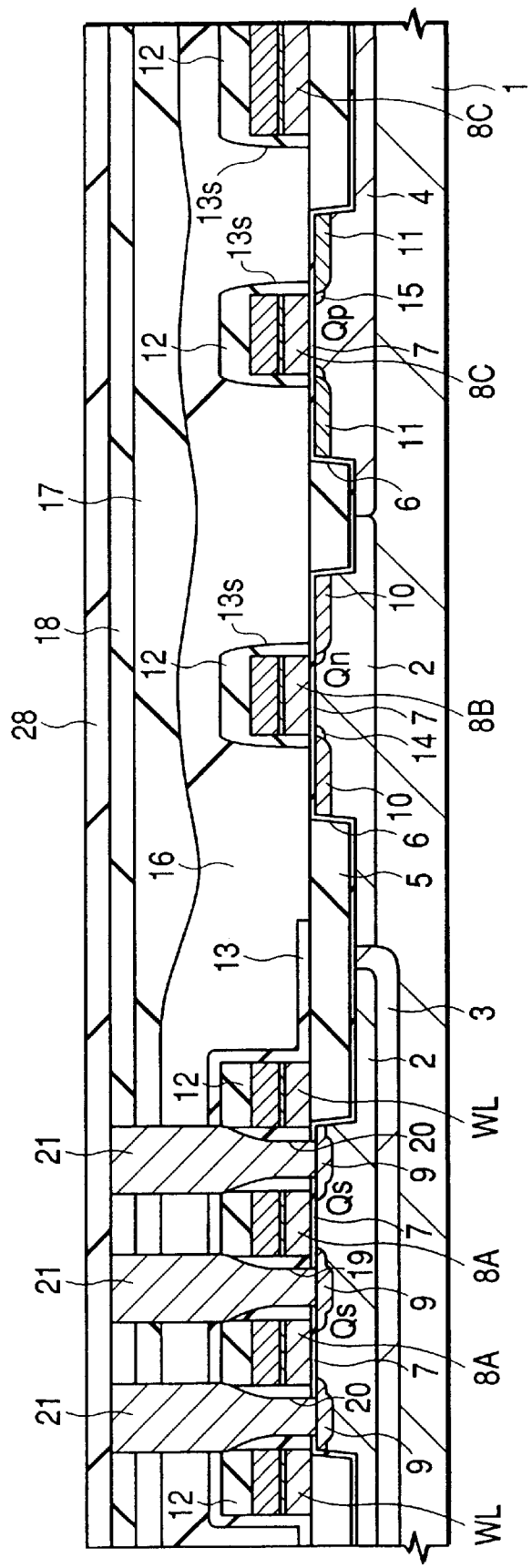
FIG. 19 is a fragmentary cross-sectional view of the semiconductor substrate, showing a step of the method of manufacturing the DRAM according to one embodiment of the present invention.

Next, as shown in FIG. 19, a silicon oxide film 28 is deposited over the silicon oxide film 18 and thereafter the semiconductor substrate 1 is heat-treated in an atmosphere of a nitrogen gas. The silicon oxide film 28 is deposited by the plasma CVD method in which, for example, the oxygen (or ozone) and tetra ethoxy silane are used for the source gas. The n-type impurity in the polycrystal silicon film constituting the plugs 21 is diffused from the bottoms of the contact holes 19 and 20 to the n⁻-type semiconductor regions 9a of the memory cell selection MISFETs Qs, so that n-type semiconductor regions (source and drain) 9 low in resistance are formed.

Figure 20:
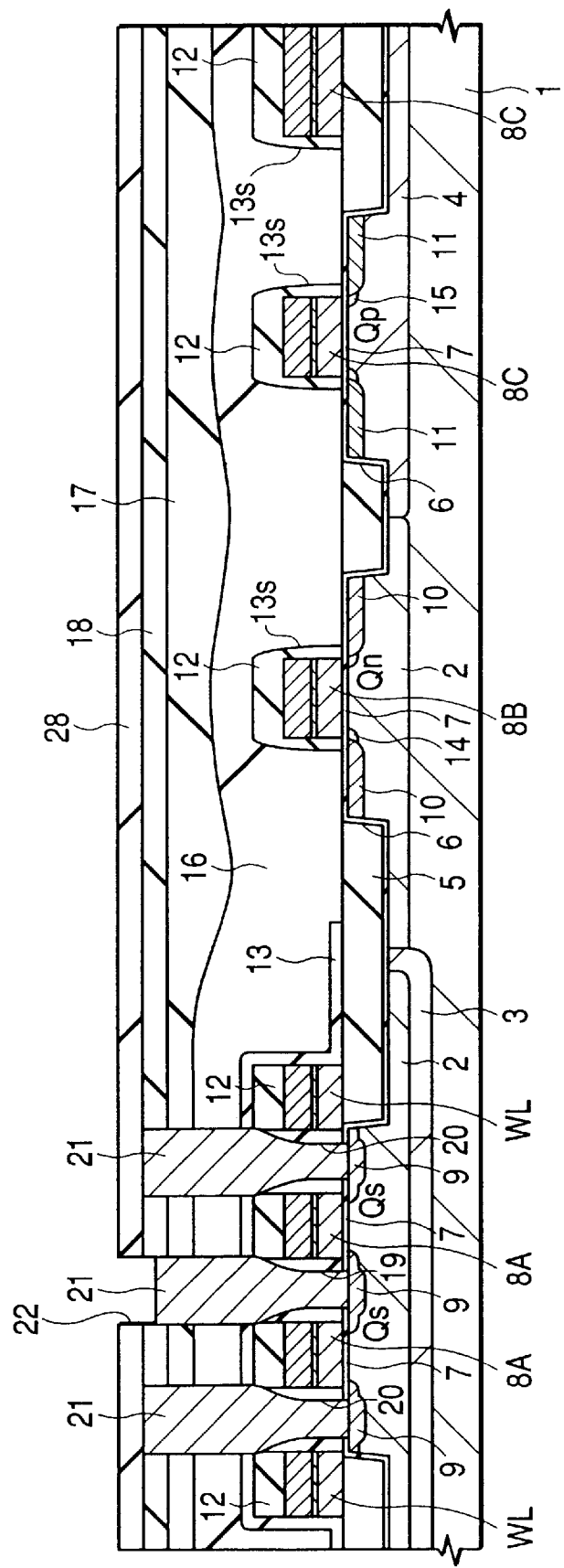
FIG. 20 is a fragmentary cross-sectional view of the semiconductor substrate, illustrating a step of the method of manufacturing the DRAM according to one embodiment of the present invention.

Next, as shown in FIG. 20, the silicon oxide film 28 provided over each contact hole 19 is removed by dry etching using a photoresist film (not shown) as a mask, so that a through hole 22 is defined. Each through hole 22 is placed above the device separation groove 6 which falls outside each active region L (see FIG. 4).

Figure 21:
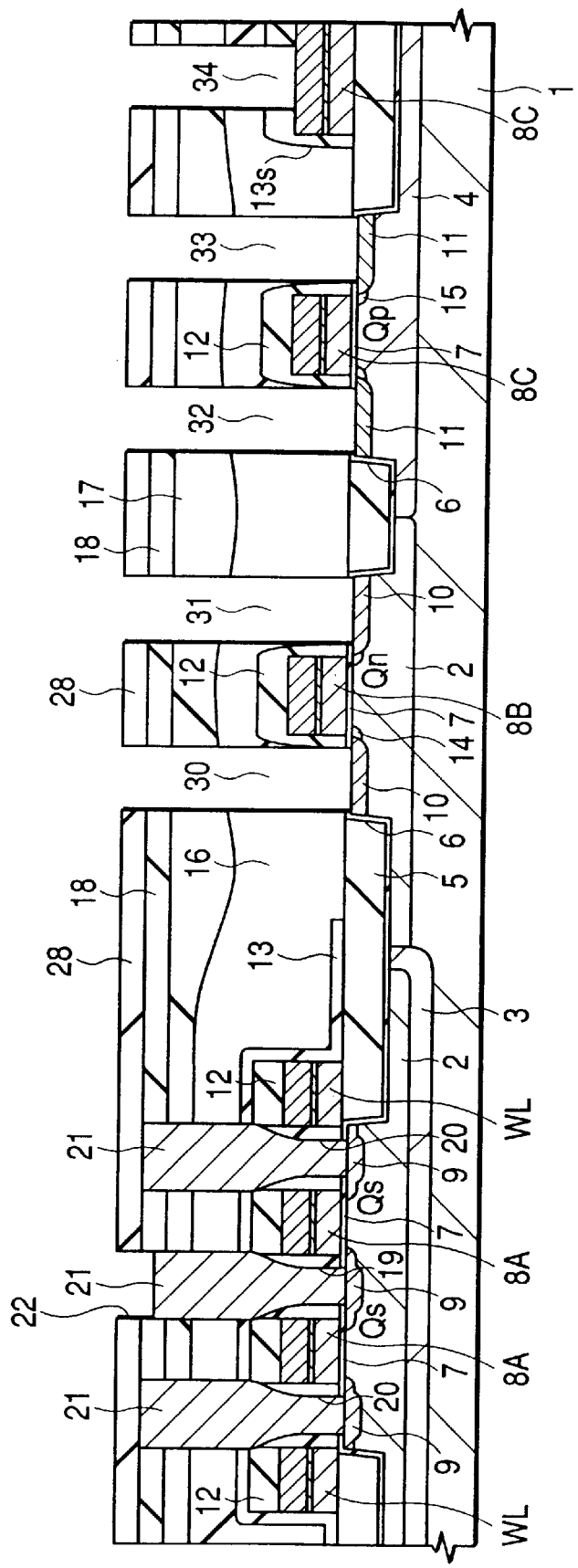
FIG. 21 is a fragmentary cross-sectional view of the semiconductor substrate, showing a step of the method of manufacturing the DRAM according to one embodiment of the present invention.

As shown in FIG. 21, the silicon oxide films 28, 18, 17, SOG film 16 and gate oxide film 7 in the peripheral circuit are then removed by dry etching using a photoresist film (not shown) as a mask, whereby contact holes 30 and 31 are defined above the n$^+$-type semiconductor regions 10 (source and drain) of each n channel MISFET Qn, and contact holes 32 and 33 are defined above the p$^+$-type semiconductor regions 11 (source and drain) of each p channel MISFET Qp. Simultaneously at this time, a contact hole 34 is defined in a portion above the gate electrode 8C of each p channel MISFET Qp and an unillustrated contact hole is defined in a portion above the gate electrode 8B of each n channel MISFET Qn.

The execution of the etching for forming the through hole 22 and the etching for forming the contact holes 30 through 34 in the different processes as described above allows prevention of a problem that the plug 21 exposed at the bottom of the shallow through hole 22 of the memory array is cut deep when the deep contact holes 30 through 34 in the peripheral circuit are defined. Incidentally, the formation of the through hole 22 and the formation of the contact holes 30 through 34 may be carried out in the order opposite to the above.

Figure 22:
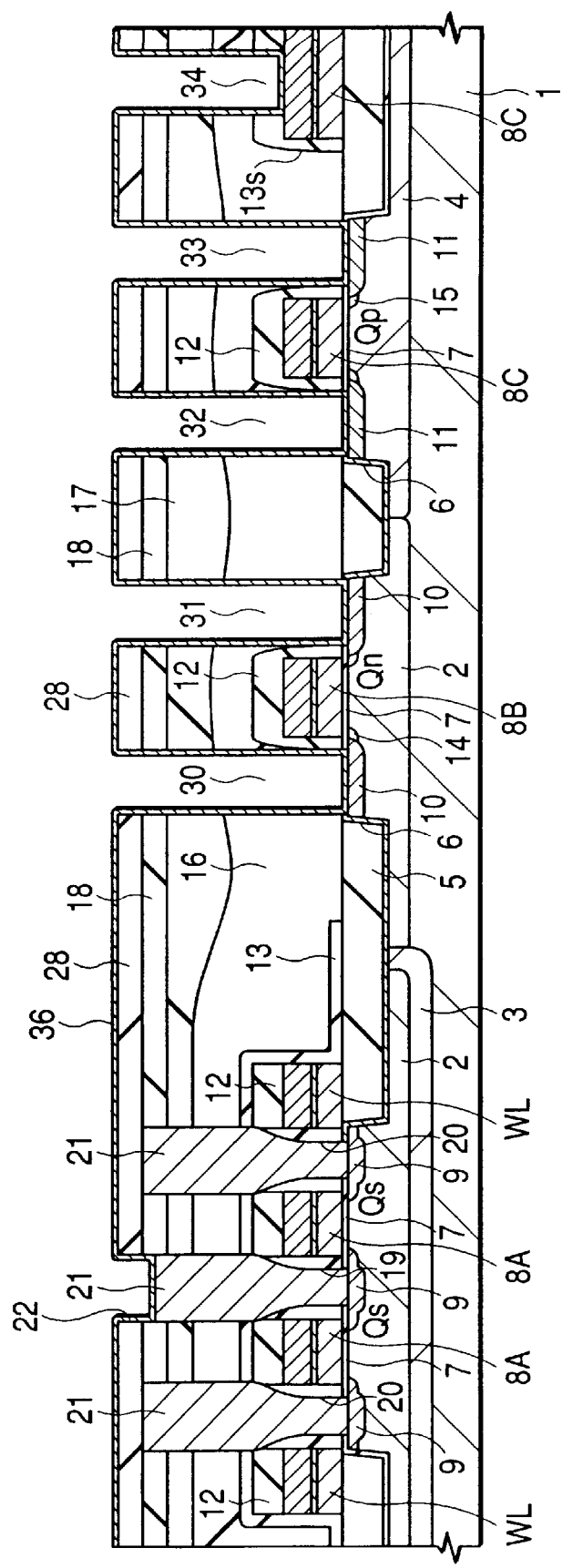
FIG. 22 is a fragmentary cross-sectional view of the semiconductor substrate, depicting a step of the method of manufacturing the DRAM according to one embodiment of the present invention.

Next, a Ti film 36 is deposited over the silicon oxide film 28 including the interior of the contact holes 30 through 34 and through hole 22 as shown in FIG. 22. The Ti film 36 is deposited by using a high-oriented sputtering method such as collimation sputtering, ionization sputtering or the like so that it is deposited even over the bottoms of the contact holes 30 through 34 large in aspect ratio with a given degree of thickness.

Figure 23:
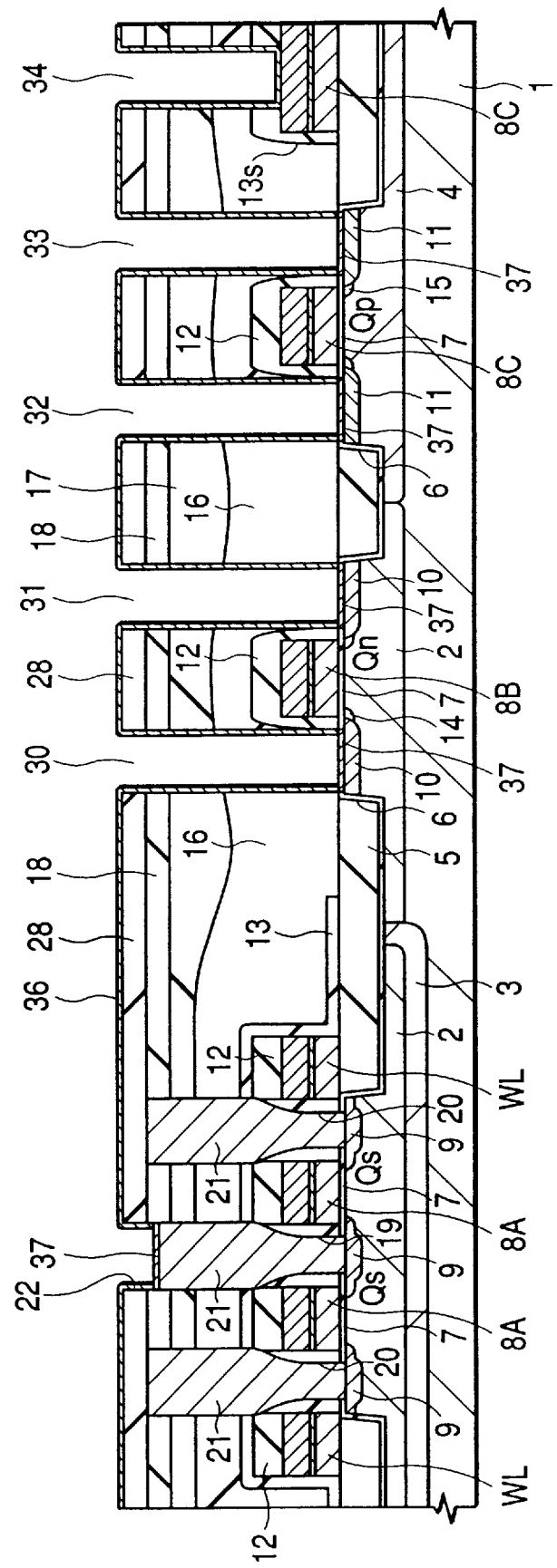
FIG. 23 is a fragmentary cross-sectional view of the semiconductor substrate, showing a step of the method of manufacturing the DRAM according to one embodiment of the present invention.

The Ti film 36 is then heat-treated in an atmosphere of an inert gas such as Ar (Argon) without being subjected to the atmosphere. An Si substrate at the bottoms of the contact holes 30 through 33 and the Ti film 36 react with each other due to the heat treatment, whereby TiSi$_2$ layers 37 are formed over the surfaces of the n$^+$-type semiconductor regions 10 (source and drain) of each n channel MISFET Qn and the surfaces of the p$^+$-type semiconductor regions 11 (source and drain) of each p channel MISFET Qp as shown in FIG. 23. At this time, the TiSi$_2$ layer 37 is formed even over the surface of the plug 21 at the bottom of each through hole 22 by the reaction between the polycrystal silicon film constituting the plug 21 and the Ti film 36.

Owing to the formation of the TiSi$_2$ layers 37 at the bottoms of the contact holes 30 through 33, portions where plugs 35 formed inside the contact holes 30 through 33 in the next process make contact with the sources and drains (n$^+$-type semiconductor regions 10 and p$^+$-type semiconductor regions 11) of the MISFETs in the peripheral circuit, can be reduced in contact resistance. Therefore, the high-speed operation of the peripheral circuit such as the sense amplifier SA, the word driver WD or the like is accelerated. Silicide layers at the bottoms of the contact holes 30 through 33 may also be formed of a high-melting point metal silicide other than TiSi such as CoSi$_2$ (cobalt silicide), TaSi$_2$ (tantalum silicide), MoSi$_2$ (molybdenum silicide) or the like.

Figure 24:
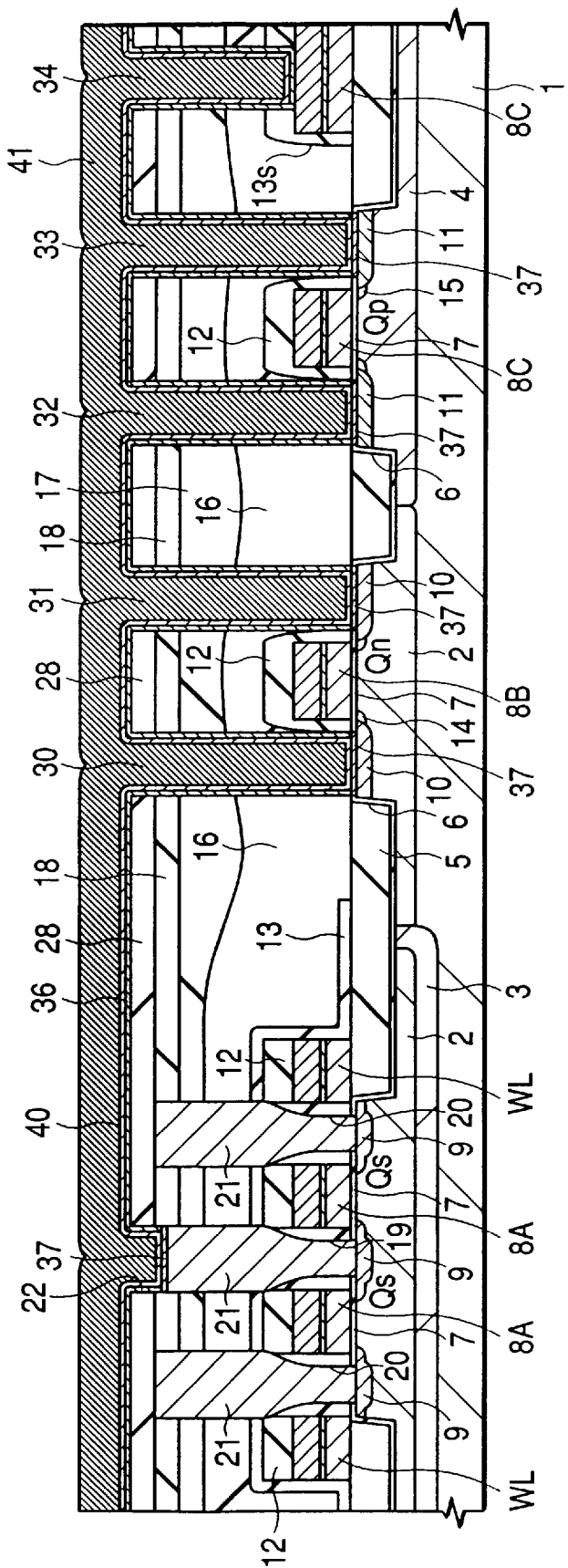
FIG. 24 is a fragmentary cross-sectional view of the semiconductor substrate, illustrating a step of the method of manufacturing the DRAM according to one embodiment of the present invention.

Next, a TiN film 40 is deposited over the TiN film 36 by the CVD method as shown in FIG. 24. Since the CVD method provides good step coverage as compared with sputtering, the TiN film 40 having a thickness of the same degree as that of the flattened portion can be deposited over the bottoms of the contact holes 30 through 34 large in aspect ratio. A W film 41 is then deposited over the TiN film 40 by a CVD method in which tungsten hexafluoride (WF$_6$), hydrogen and monosilane (SiH$_4$) are used for a source gas, so that the W film 41 is completely embedded into the contact holes 30 through 34 and through hole 22.

Figure 25:
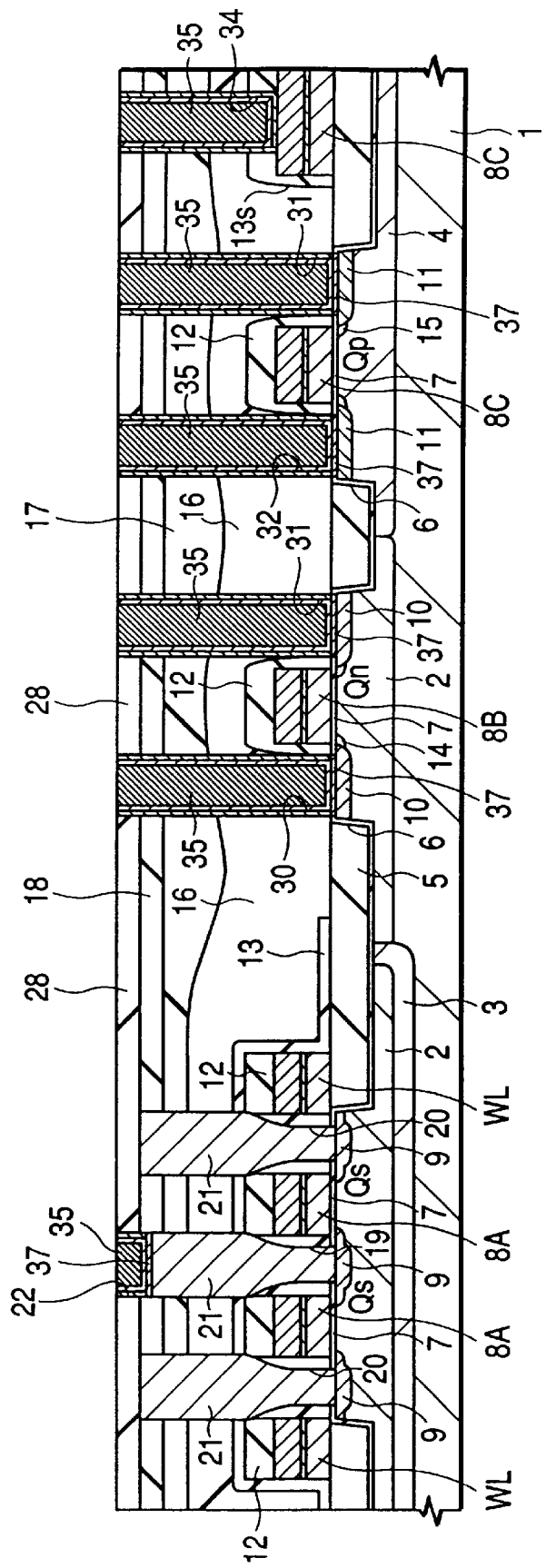
FIG. 25 is a fragmentary cross-sectional view of the semiconductor substrate, showing a step of the method of manufacturing the DRAM according to one embodiment of the present invention.

Next, the W film 41, TiN film 40 and Ti film 36 over the silicon oxide film 28 are removed (polished back) using the CMP method as shown in FIG. 25, so that the plugs 35 composed of the W film 41, TiN film 40 and Ti film 36 are formed inside the contact holes 30 through 34 and through hole 22.

Incidentally, the plugs 35 may be formed by removing (etching back) the W film 41, TiN film 40 and Ti film 36 over the silicon oxide film 28 by dry etching. Further, the plugs 35 may be composed principally of the TiN film 40 without using the W film 41. Namely, the plugs 35 may be formed by embedding the TiN film 40 to a large thickness into the contact holes 30 through 34 and through hole 22. In this case, the plugs 35 increase in resistance to some extent as compared with the case in which they are composed principally of the W film 41. Since, however, the TiN film 40 serves as an etching stopper when a W film 42 deposited over the silicon oxide film 28 is dry-etched in the next process to form each bit line BL and wires or interconnections 23 through 26 corresponding to a first wiring layer, of the peripheral circuit, margins of displacements in alignment of the interconnections 23 through 26 with the contact holes 30 through 34 can be remarkably improved and the degree of freedom of the layout of the interconnections 23 through 26 is greatly improved.

Figure 26:
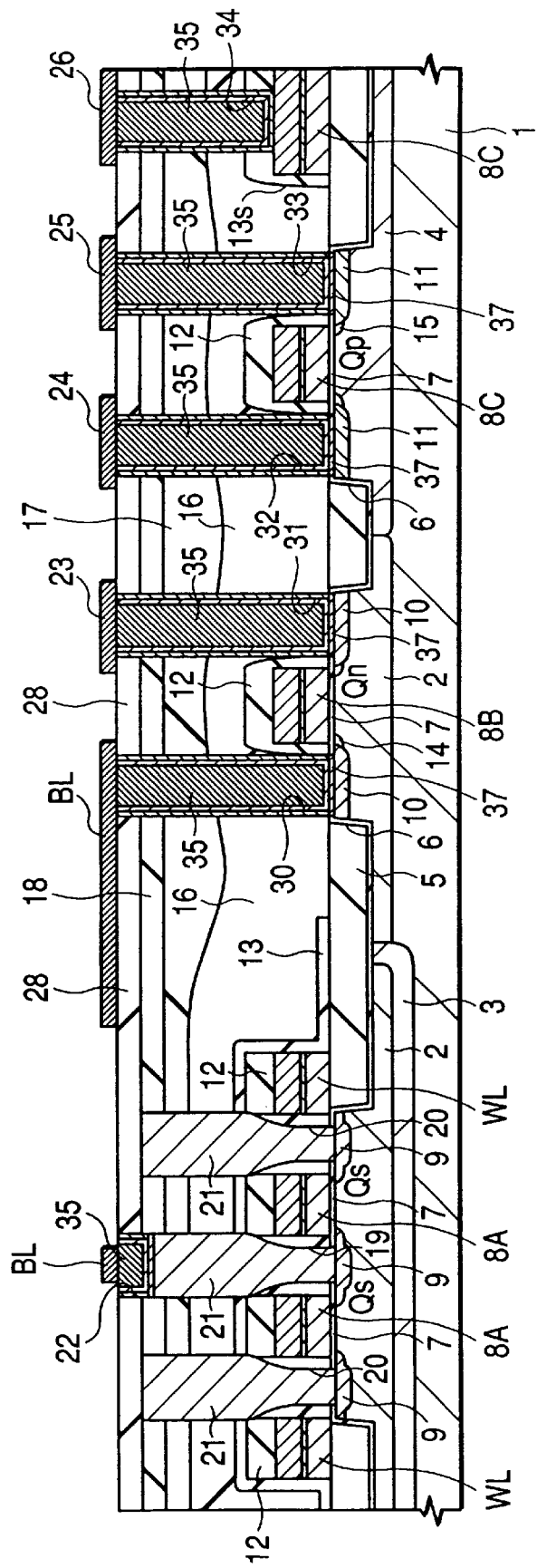
FIG. 26 is a fragmentary cross-sectional view of the semiconductor substrate, illustrating a step of the method of manufacturing the DRAM according to one embodiment of the present invention.

Next, as shown in FIG. 26, the W film 42 is deposited over the silicon oxide film 28 by sputtering. Thereafter, the W film 42 is dry-etched with a photoresist film (not shown) formed over the W film 42 as a mask to thereby form each bit line BL in the memory array and form the interconnections 23 through 26 corresponding to the first wiring layer in the peripheral circuit. Incidentally, there may be a case in which, since the W film 42 is high in light reflectivity, the photoresist film causes halation upon exposure to thereby reduce the dimensional accuracy of the patterns (width and space). In order to prevent this, a reflection preventive film is deposited over the W film 42 and the photoresist film may be applied thereto. An organic material or a metal material (e.g., TiN film) low in light reflectivity is used for the reflection preventive film.

Figure 27:
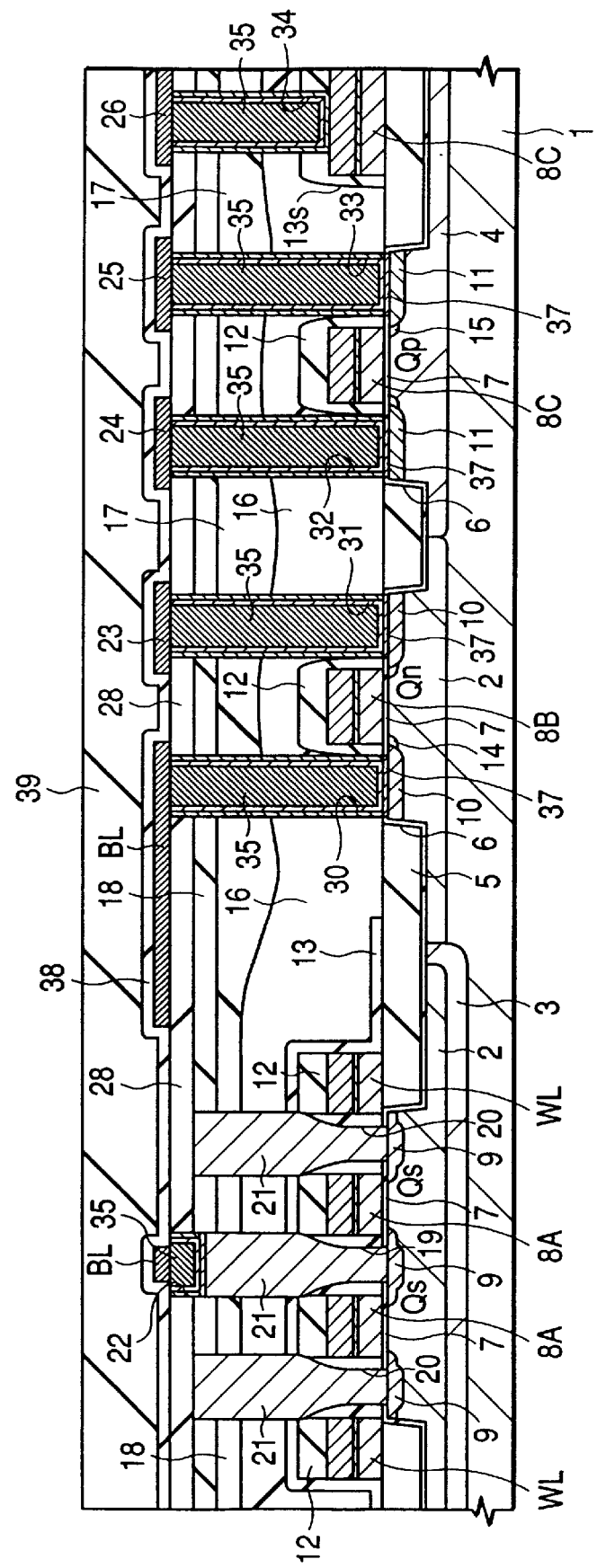
FIG. 27 is a fragmentary cross-sectional view of the semiconductor substrate, depicting a step of the method of manufacturing the DRAM according to one embodiment of the present invention.

Next, as shown in FIG. 27, a silicon oxide film 38 is deposited over each bit line BL and the interconnections 23 through 26 corresponding to the first wiring layer, and a silicon oxide film 39 is then deposited over the silicon oxide film 38. Thereafter, the surface of the silicon oxide film 39 is flattened by the CMP method. The silicon oxide films 38 and 39 are deposited by the plasma CVD method in which, for example, the oxygen (or ozone) and tetra ethoxy silane are used for the source gas.

Figure 28:
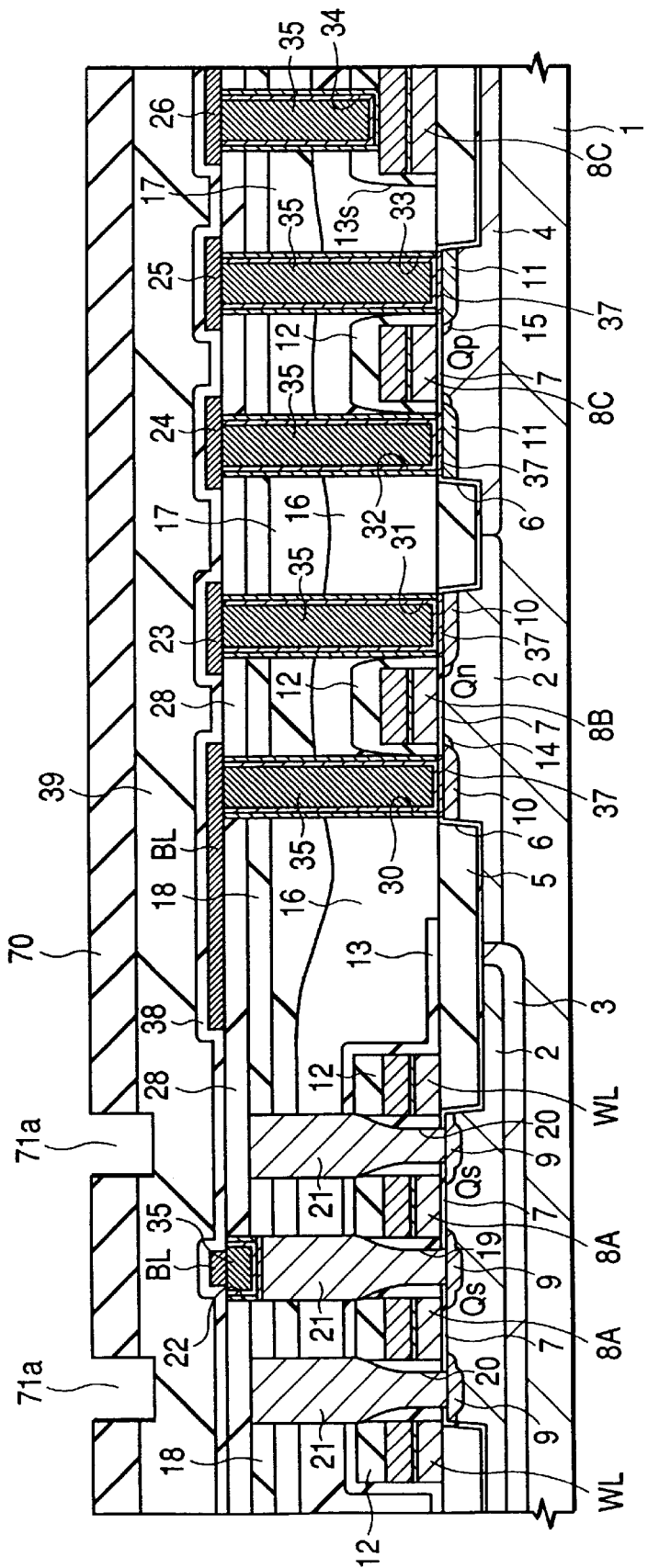
FIG. 28 is a fragmentary cross-sectional view of the semiconductor substrate, showing a step of the method of manufacturing the DRAM according to one embodiment of the present invention.

Next, a polycrystal silicon film 70 is deposited over the silicon oxide film 39 by the CVD method as shown in FIG. 28. Thereafter, the polycrystal silicon film 70 is dry-etched using a photoresist film (not shown) as a mask to thereby define grooves 71a above the contact holes 20.

Figure 29:
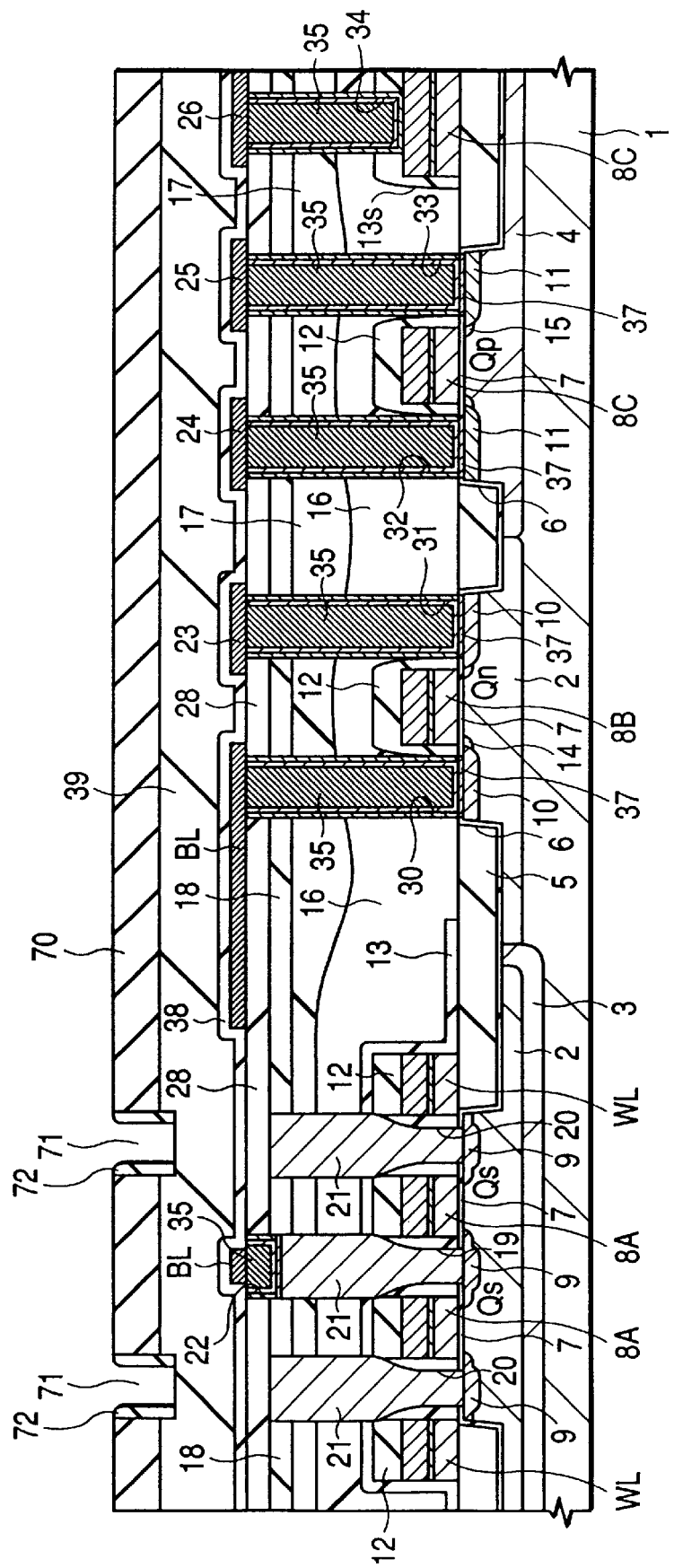
FIG. 29 is a fragmentary cross-sectional view of the semiconductor substrate, illustrating a step of the method of manufacturing the DRAM according to one embodiment of the present invention.

Sidewall spacers 72 composed of the polycrystal silicon film are next formed over the side walls of the grooves 71a as shown in FIG. 29. The sidewall spacers 72 are formed by depositing a polycrystal silicon film (not shown) over the polycrystal silicon film 70 including the interior of the grooves 71a by the CVD method and thereafter anisotropically etching the polycrystal silicon film to thereby leave it on the side walls of the grooves 71a. Owing to the formation of the sidewall spacers 72, the internal diameter of each groove 71a can be set smaller than the minimum processing size by the lithography.

Figure 30:
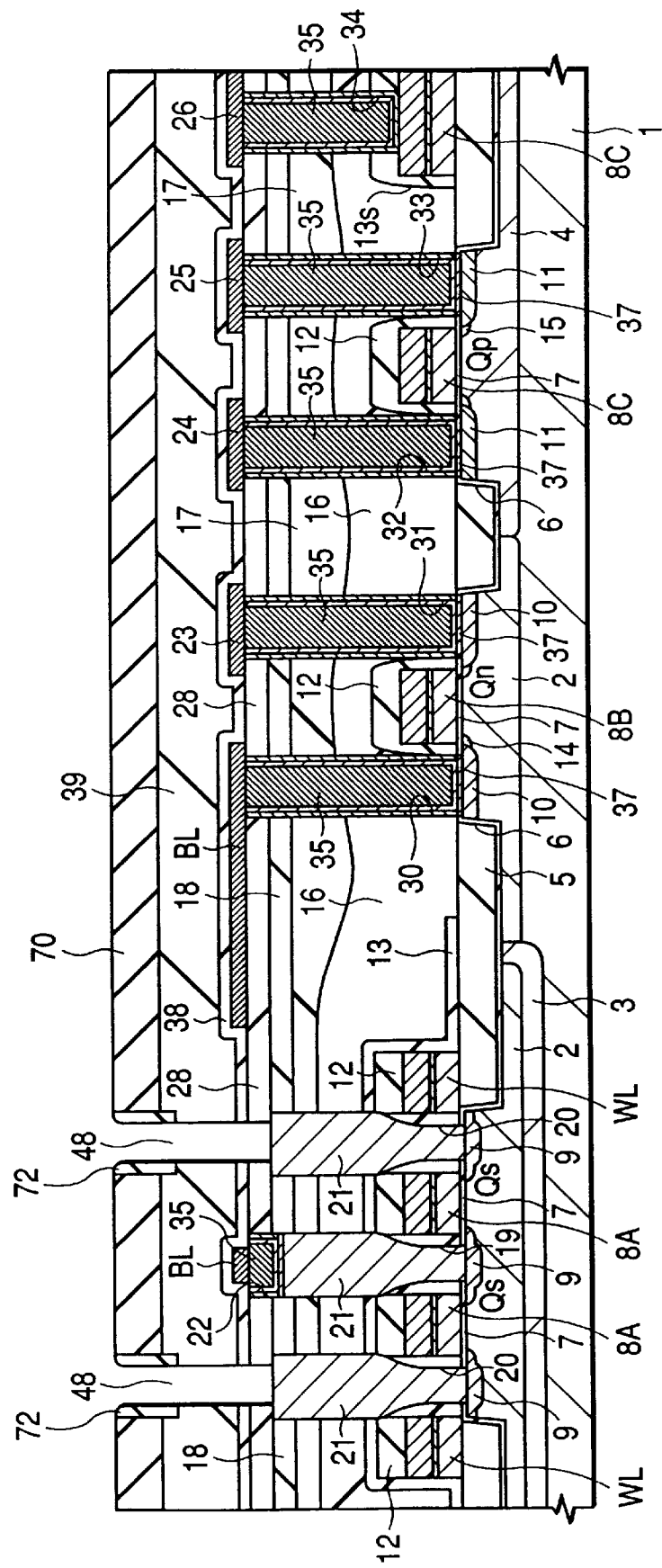
FIG. 30 is a fragmentary cross-sectional view of the semiconductor substrate, depicting a step of the method of manufacturing the DRAM according to one embodiment of the present invention.

Next, the silicon oxide films 38 and 28 at the bottoms of the grooves 71a are dry-etched using the polycrystal silicon film 70 and the sidewall spacers 72 as masks as shown in FIG. 30, thereby defining through holes 48 which extend through space regions for one bit line BL and another bit line BL adjacent thereto so as to reach the contact holes 20. Since each through hole 48 is defined by etching, using each sidewall spacer 72 on the side wall of each groove 71a as a mask, the internal diameter of each through hole 48 can be set smaller than the minimum processing size by the lithography. Thus, since a margin of the alignment of the space region for each bit line BL with each through hole 48 can be sufficiently ensured, plugs 49 respectively embedded into the through holes 48 in the next process or process step can be prevented from, causing a malfunction or trouble, such as a short to each bit line BL or the plug 35 placed therebelow.

Figure 31:
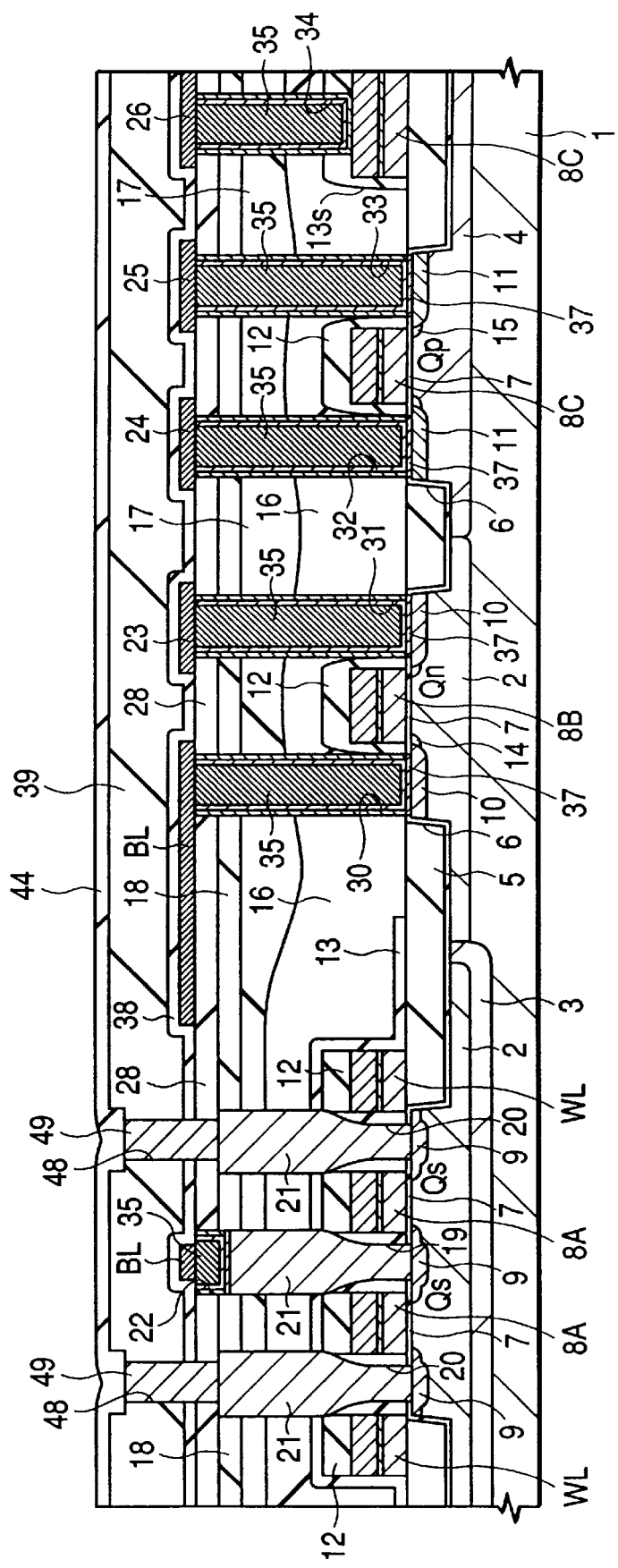
FIG. 31 is a fragmentary cross-sectional view of the semiconductor substrate, showing a step of the method of manufacturing the DRAM according to one embodiment of the present invention.

Next, as shown in FIG. 31, a silicon nitride film 44 is deposited over the silicon oxide film 39 by the CVD method after the plugs 49 comprised of the polycrystal silicon film have been formed inside the through holes 48. The plugs 49 are formed by depositing a polycrystal silicon film (not shown) doped with the n-type impurity (e.g., P (phosphorous)) over the polycrystal silicon film 70 in the interior of the through holes 48 and thereafter etching back the polycrystal silicon film together with the polycrystal silicon film 70 and the sidewall spacers 72.

Figure 32:
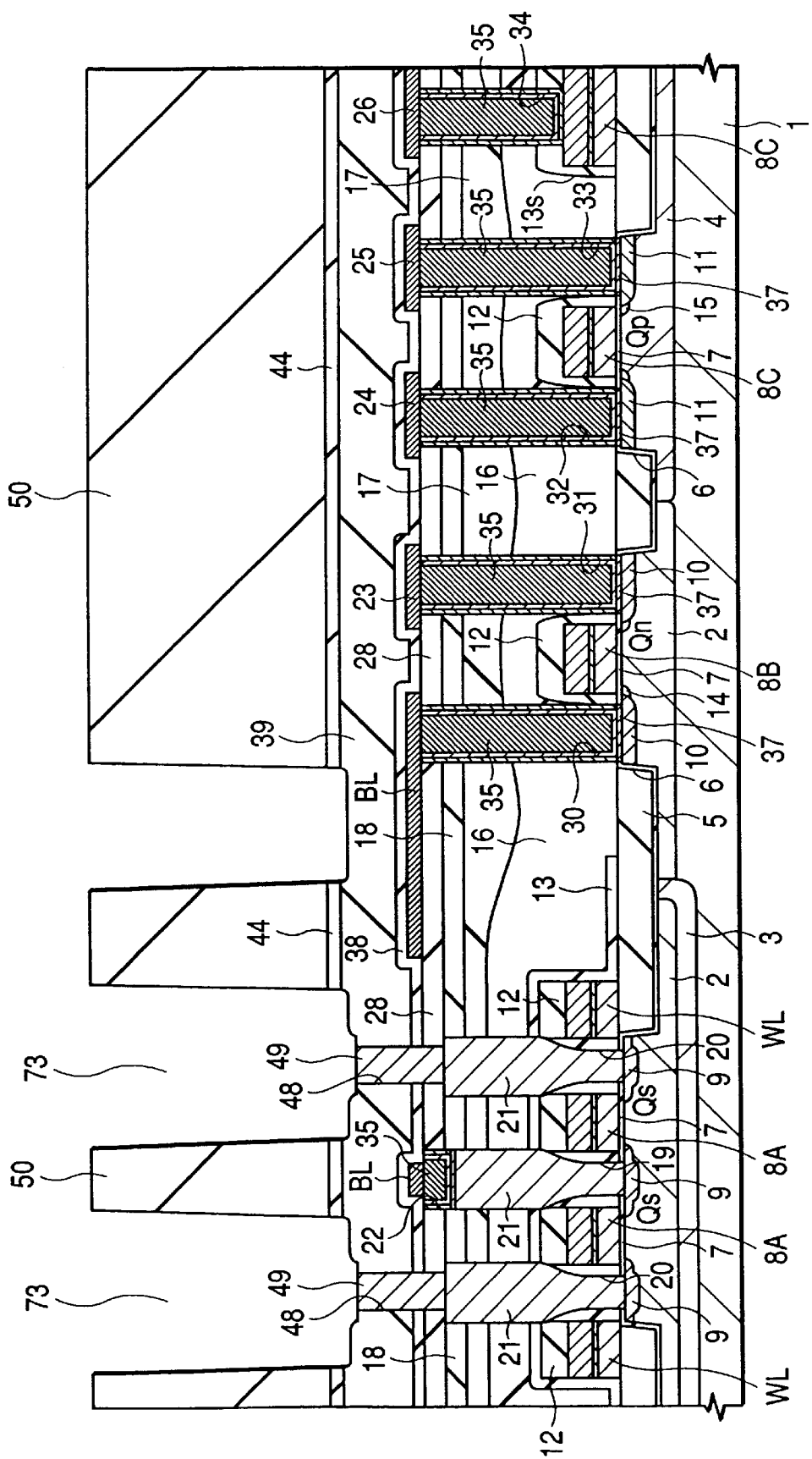
FIG. 32 is a fragmentary cross-sectional view of the semiconductor substrate, illustrating a step of the method of manufacturing the DRAM according to one embodiment of the present invention.

Next, as shown in FIG. 32, a silicon oxide film 50 is deposited over the silicon nitride film 44 and thereafter the silicon oxide film 50 and the silicon nitride film 44 placed therebelow are dry-etched using a photoresist (not shown) as a mask, whereby grooves 73 are defined above the through holes 48. Since a lower electrode 45 of each information storage capacitive element C is formed along the inner walls of the grooves 73, it is necessary to deposit the silicon oxide film 50 with a large film thickness (e.g., of about 1.3 $\mu$m) for the purpose of increasing the surface area of the lower electrode 45 to thereby increase the quantity of storage charge. The silicon oxide film 50 is deposited by the plasma CVD method in which, for example, oxygen (or ozone) and tetra ethoxy silane are used for the source gas.

Figure 33:
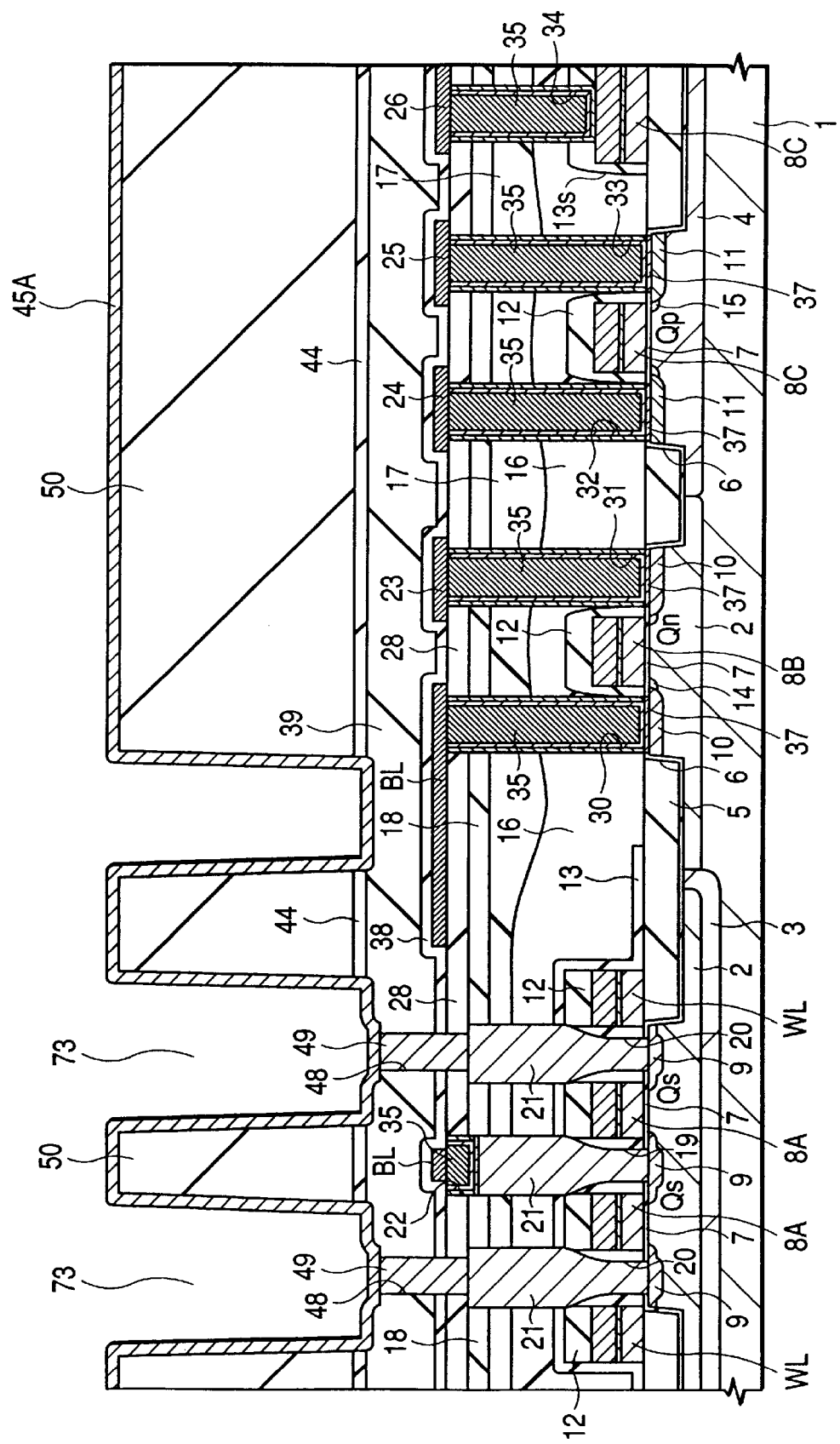
FIG. 33 is a fragmentary cross-sectional view of the semiconductor substrate, showing a step of the method of manufacturing the DRAM according to one embodiment of the present invention.

Next, an amorphous silicon film 45A doped with the n-type impurity (e.g., P (phosphorus)) is deposited over the silicon oxide film 50 in the interior of each groove 73 by the CVD method as shown in FIG. 33.

Figure 34:
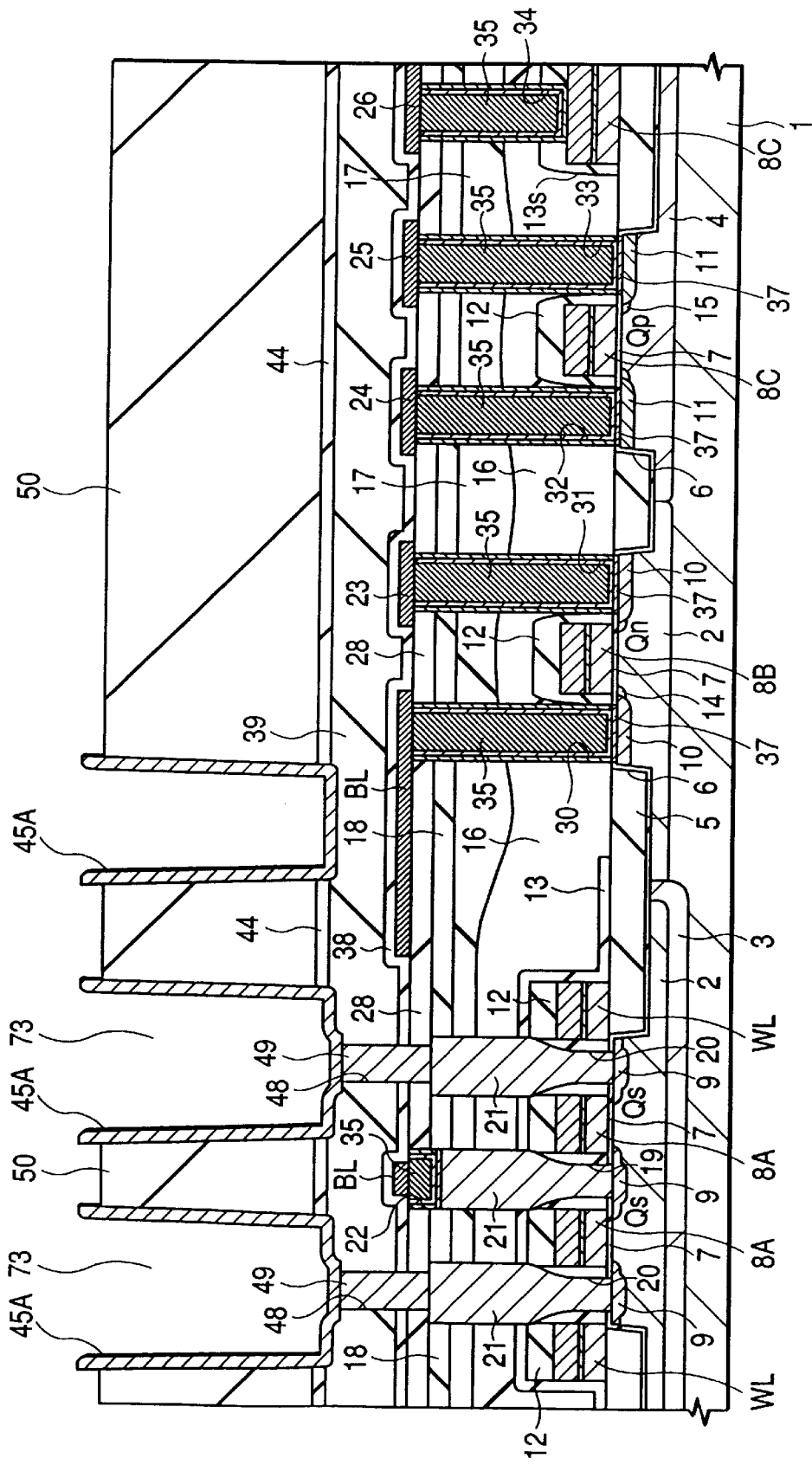
FIG. 34 is a fragmentary cross-sectional view of the semiconductor substrate, depicting a step of the method of manufacturing the DRAM according to one embodiment of the present invention.
Figure 35:
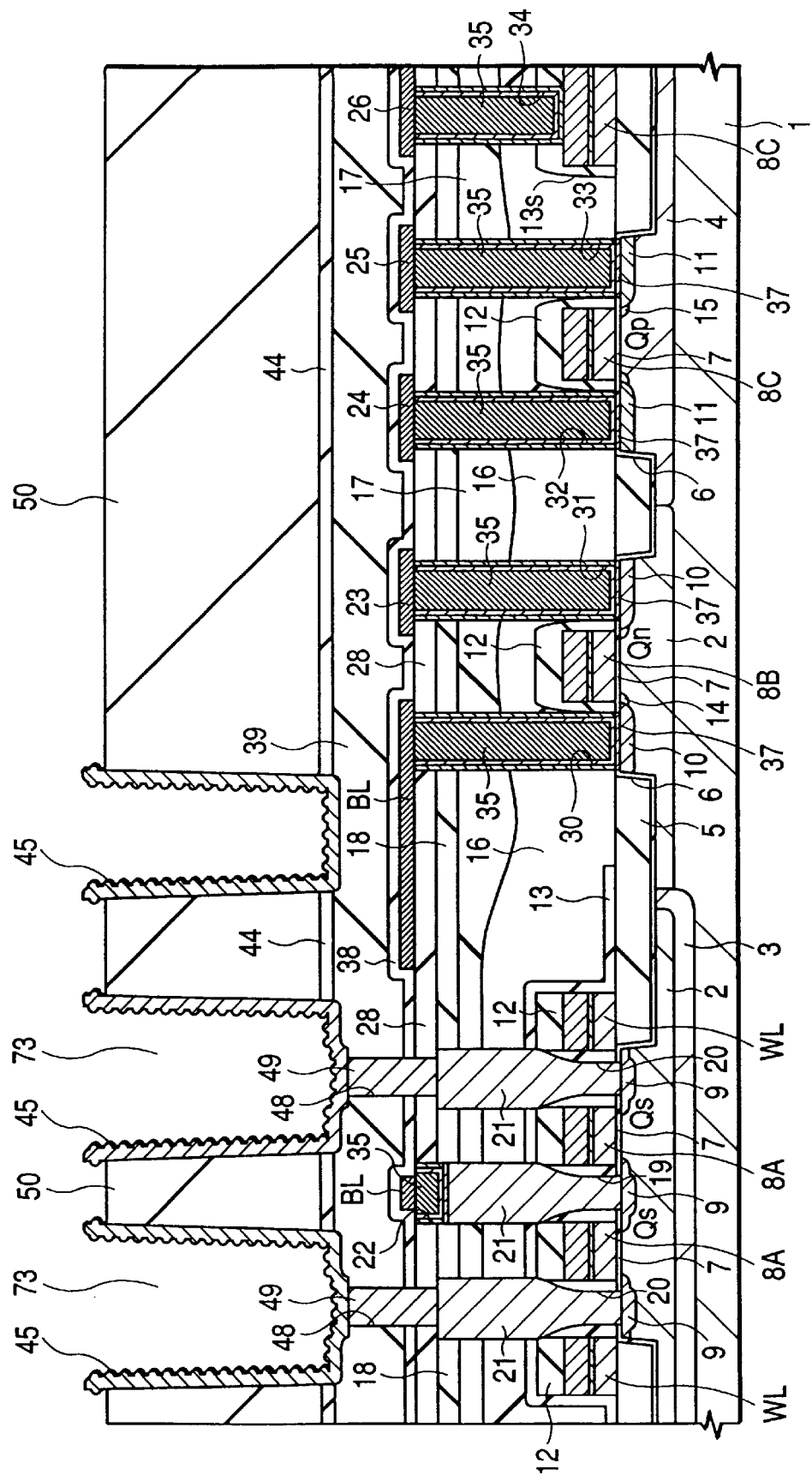
FIG. 35 a fragmentary cross-sectional view of the semiconductor substrate, showing a step of the method of manufacturing the DRAM according to one embodiment of the present invention.

Next, the amorphous silicon film 45A provided over the silicon oxide film 50 is etched back and thereby removed as shown in FIG. 34. Thereafter, the surface of the amorphous silicon film 45A left inside each groove 73 is cleaned with an etchant of hydrofluoric acid. Subsequently, the surface of each amorphous silicon film 45A is supplied with monosilane in an atmosphere under reduced pressure and thereafter the semiconductor substrate 1 is heat-treated to polycrystallize the amorphous silicon film 45A and grow silicon particles over the surface thereof, whereby each lower electrode 45 comprised of the polycrystal silicon film whose surface has been roughened, is formed as shown in FIG. 35. The lower electrode 45 may be composed of a conductive material other than the polycrystalline silicon, e.g., a high-melting point metal such as W, Ru (ruthenium), or conductive metallic oxide such as RuO (ruthenium oxide), IrO (iridium oxide).

Figure 36:
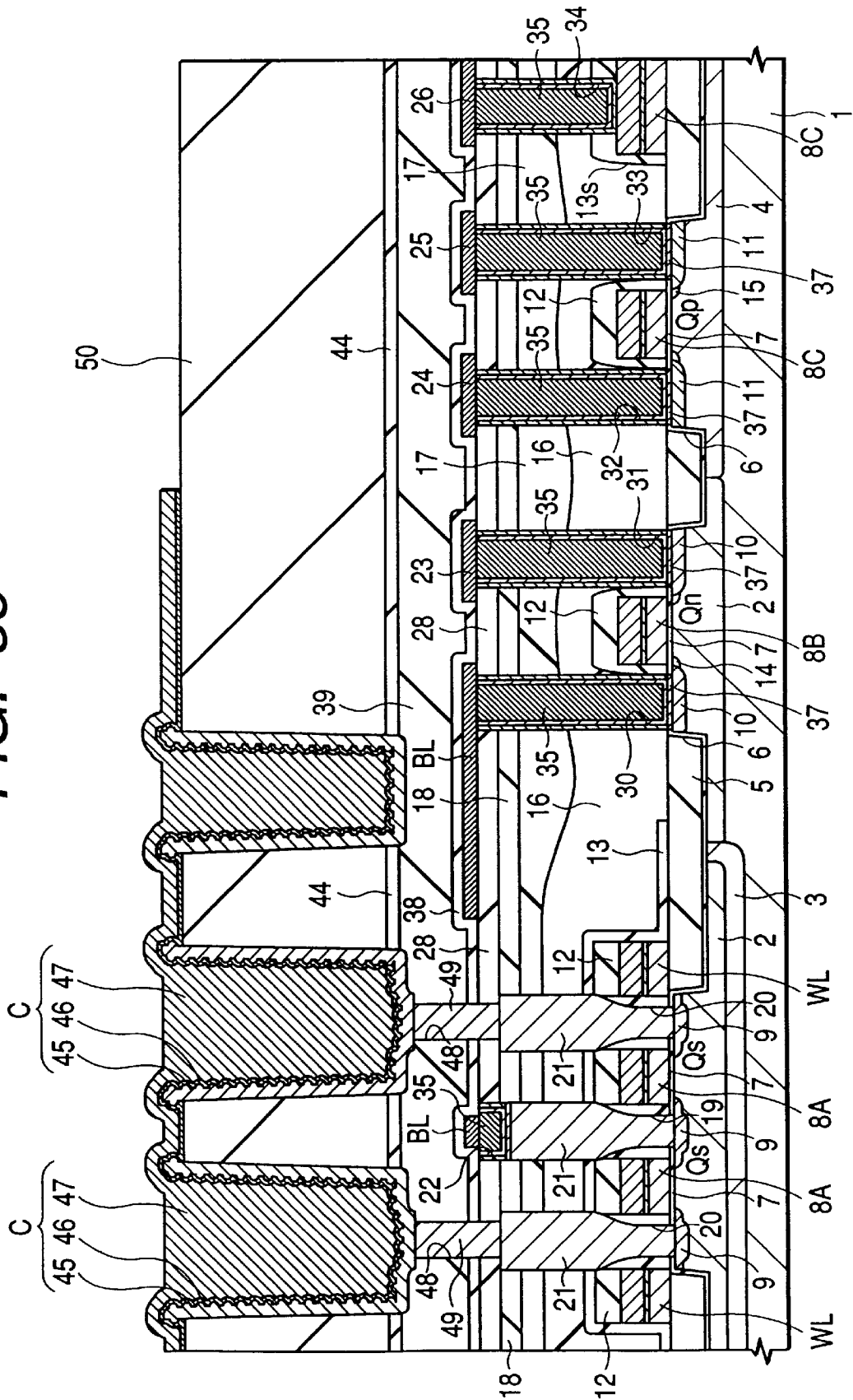
FIG. 36 is a fragmentary cross-sectional view of the semiconductor substrate, illustrating a step of the method of manufacturing the DRAM according to one embodiment of the present invention.

Next, as shown in FIG. 36, a $Ta_2O_5$ film 46 is deposited over the lower electrode 45 and is heat-treated in an oxidative atmosphere to thereby improve the quality of the film. Thereafter, a TiN film (not shown) is deposited over the $Ta_2O_5$ film 46, and the TiN film and $Ta_2O_5$ film 46 are patterned by dry etching using a photoresist film (not shown) as a mask, whereby each information storage capacitive element C comprised of the upper electrode 47 composed of the TiN film, the capacitvie insulating film composed of the $Ta_2O_5$ film 46, and the lower electrode 45 is formed. The $Ta_2O_5$ film 46 is deposited by a CVD method in which penta ethoxy tantalum $(Ta(OC_2H_5)_5)$ is used for a source gas. The TiN film is deposited by utilizing the CVD method and sputtering in combination.

Each memory cell comprised of the memory cell selection MISFET Qs and the information storage capacitive element C electrically series-connected thereto is completed according to the process steps used so far. Incidentally, the capacitive insulating film of each information storage capacitive element C may be comprised of a ferroelectric film or a film (high dielectric-constant film) having a high dielectric constant, which is composed of metallic oxides such as BST, STO, $BaTiO_3$ (barium titanate), $PbTiO_3$ (lead titanate), PZT $(PbZr_xTi_{1-x}O_3)$, PLT $(PbLa_xTi_{1-x}O_3)$, PLZT. Further, the upper electrode 47 may be composed of a conductive film other than the TiN film, e.g., a W film or the like.

Figure 37:
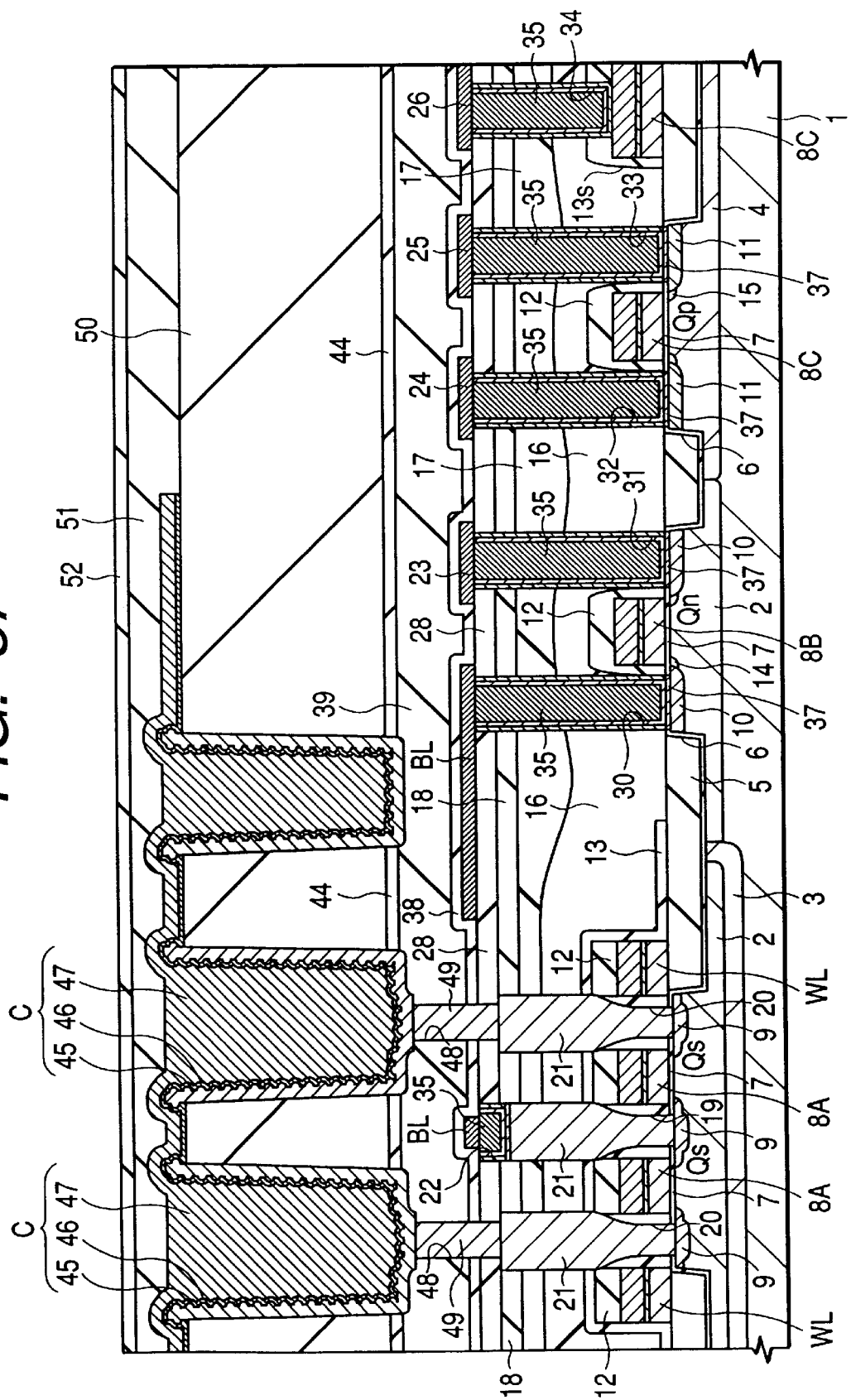
FIG. 37 is a fragmentary cross-sectional view of the semiconductor substrate, showing a step of the method of manufacturing the DRAM according to one embodiment of the present invention.

Next, as shown in FIG. 37, a silicon oxide film 51 is deposited over each information storage capacitive element C. The silicon oxide film 51 is then polished by the CMP method to flatten the surface thereof. Afterwards, a silicon oxide film 52 is deposited over the silicon oxide film 51. The silicon oxide films 51 and 52 are deposited by the plasma CVD method in which, for example, oxygen (or ozone) and tetra ethoxy silane are used for the source gas. The upper silicon oxide film 52 is deposited to mend or fix micro flaws on the surface of the lower silicon oxide film 51, which are produced when it is polished by the CMP method.

Figure 38:
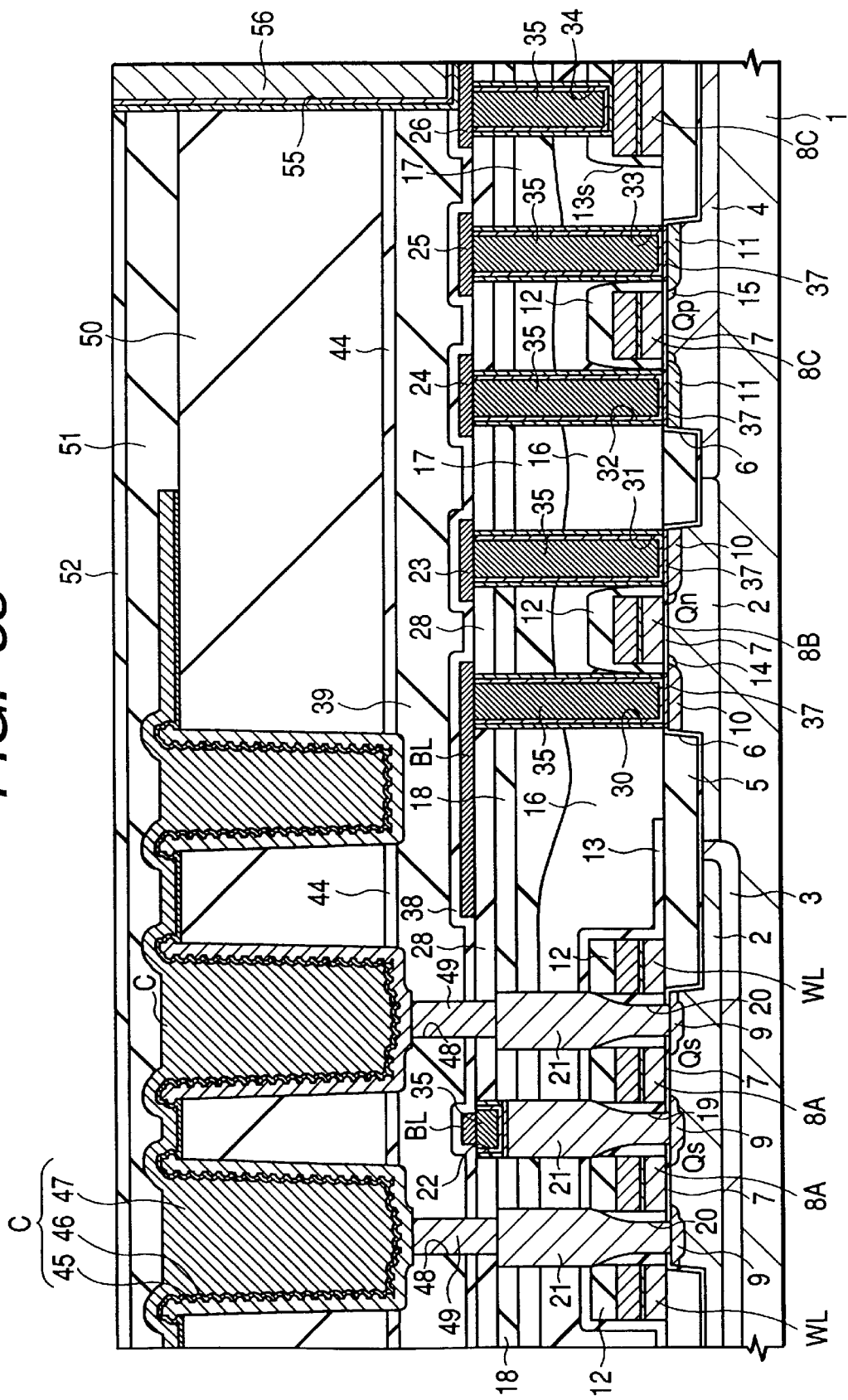
FIG. 38 is a fragmentary cross-sectional view of the semiconductor substrate, depicting a step of the method of manufacturing the DRAM according to one embodiment of the present invention.

Next, the silicon oxide films 52, 51 and 50, silicon nitride film 44 and silicon oxide films 39 and 38 in the peripheral circuit region are etched using a photoresist film (not shown) as a mask as shown in FIG. 38. Thus, a through hole 55 is defined in the portion above the interconnection 26 corresponding to the first wiring layer and thereafter a plug 56 is formed inside the through hole 55. Since the through hole 55 is defined so as to extend through the insulating films corresponding to a plurality of layers containing the silicon oxide film 50 formed with the large film thickness, the aspect ratio thereof increases extremely. The plug 56 is formed by, for example, depositing a Ti film over the silicon oxide film 52 by sputtering, depositing a TiN film and a W film thereon by the CVD method and thereafter etching back these films to thereby leave the deposited film inside the through hole 55.

Figure 39:
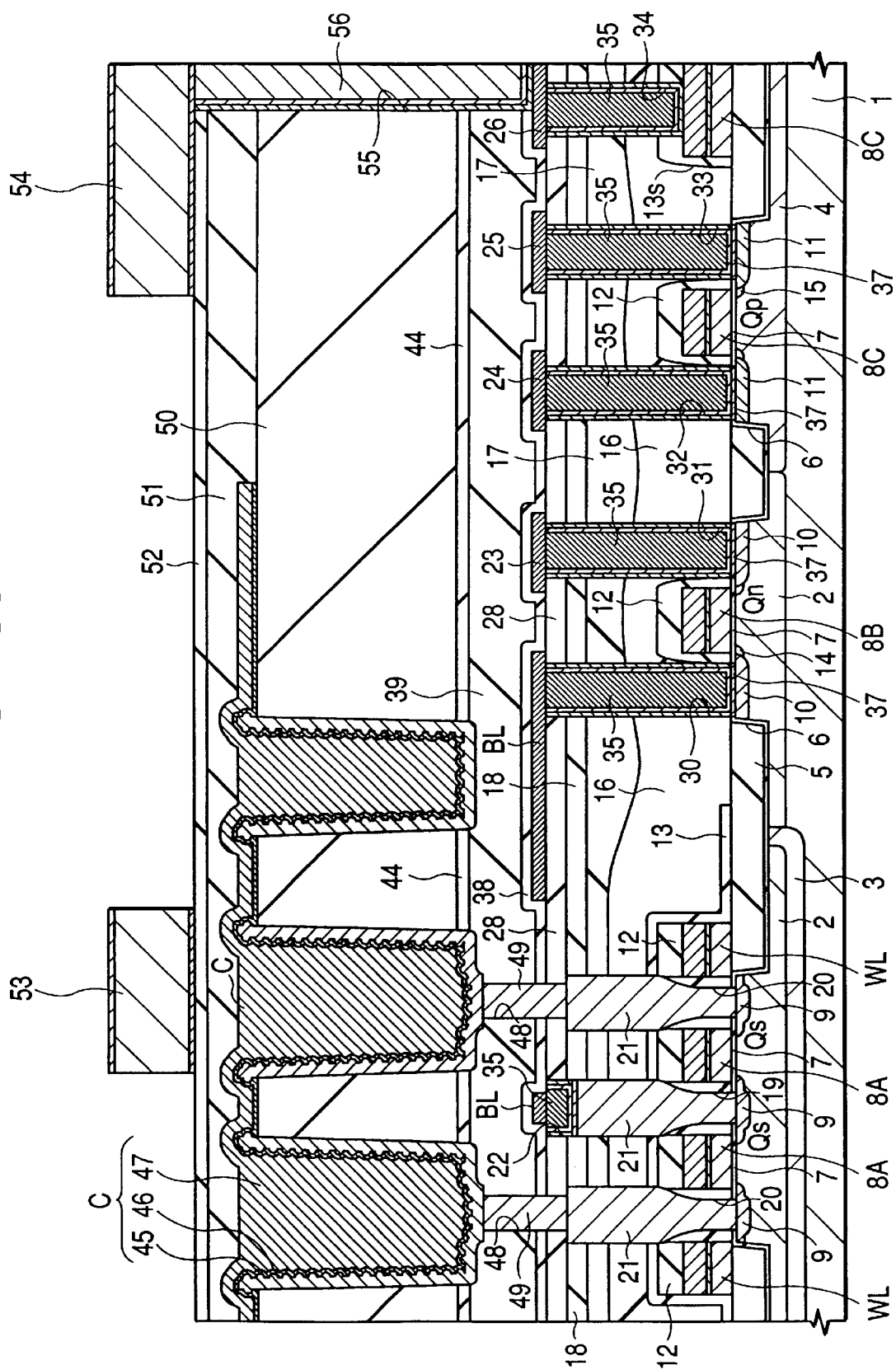
FIG. 39 is a fragmentary cross-sectional view of the semiconductor substrate, showing a step of the method of manufacturing the DRAM according to one embodiment of the present invention.

Next, wires or interconnections 53 and 54 corresponding to a second wiring layer are formed over the silicon oxide film 52 as shown in FIG. 39. Of the interconnections 53 and 54 corresponding to the second wiring layer, the interconnection 54 formed in the peripheral circuit region is electrically connected to the interconnection 26 of the first wiring layer via the through hole 55. The interconnections 53 and 54 of the second wiring layer are formed by, for example, sequentially depositing a TiN film, an Al (Aluminum) alloy film, a Ti film and a TiN film over the silicon oxide film 52 by sputtering and thereafter patterning these films by dry etching using a photoresist film as a mask.

Figure 40:
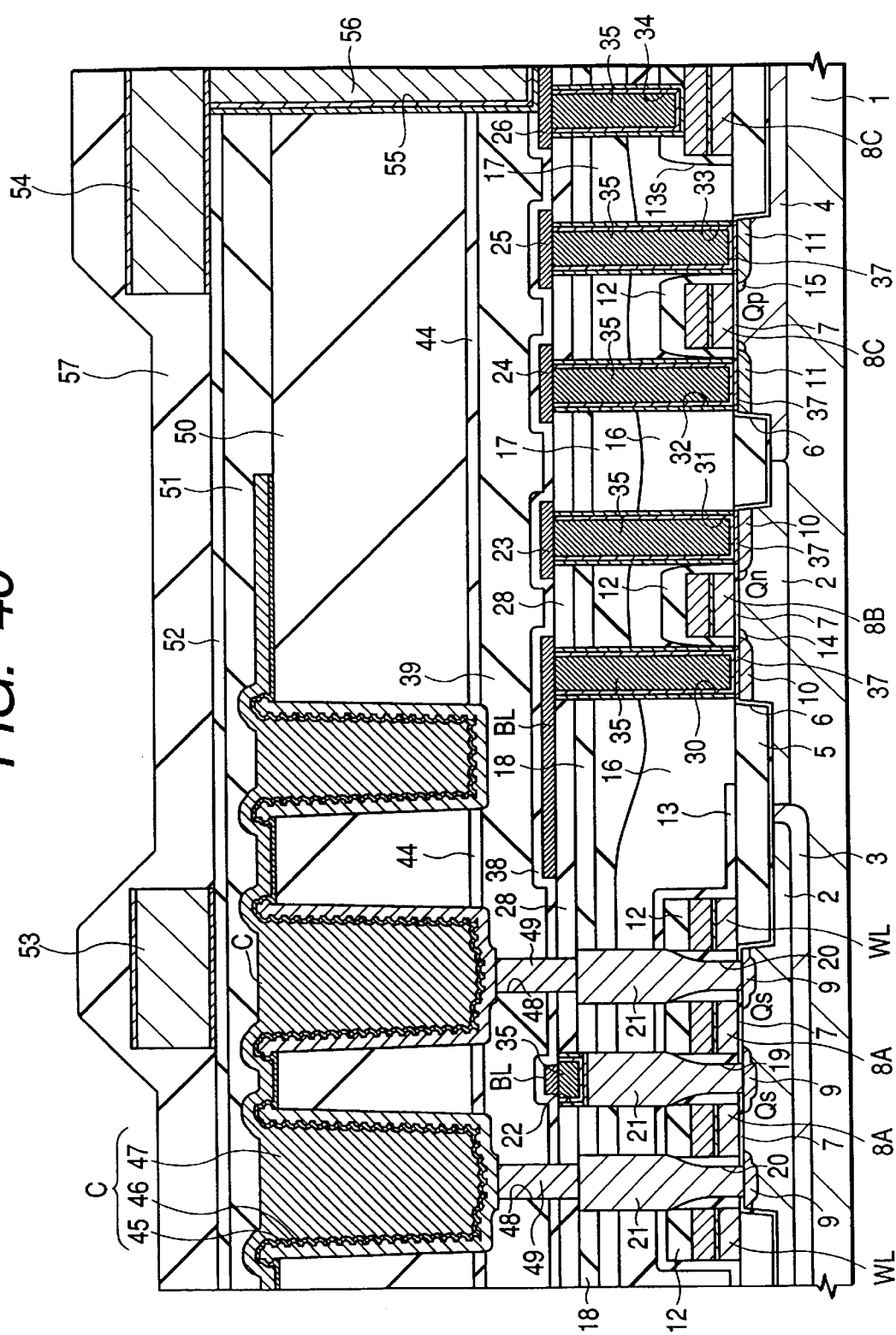
FIG. 40 is a fragmentary cross-sectional view of the semiconductor substrate, illustrating a step of the method of manufacturing the DRAM according to one embodiment of the present invention.

A silicon oxide film 57 is next deposited over the interconnections 53 and 54 corresponding to the second wiring layer as shown in FIG. 40. Since the interconnections 53 and 54 of the second wiring layer are formed with a large film thickness (of 400 nm or more, for example) as compared with the interconnections 23 through 26 of the first wiring layer, it is difficult to bury spaces defined between the interconnections in a dense region (not shown) of the interconnections of the second wiring layer when the silicon oxide film is deposited by the above-described plasma CVD method, for example. Thus, in the present embodiment, the silicon oxide film 57 is deposited by using a high-density plasma CVD method in which monosilane, oxygen and Ar (Argon) are used for a source gas. Since the silicon oxide film 57 deposited by the high-density plasma CVD method is excellent in gap-filling characteristic, the silicon oxide film can be sufficiently embedded into the spaces defined between the interconnections even in the dense region of the interconnections corresponding to the second wiring layer.

Figure 41:
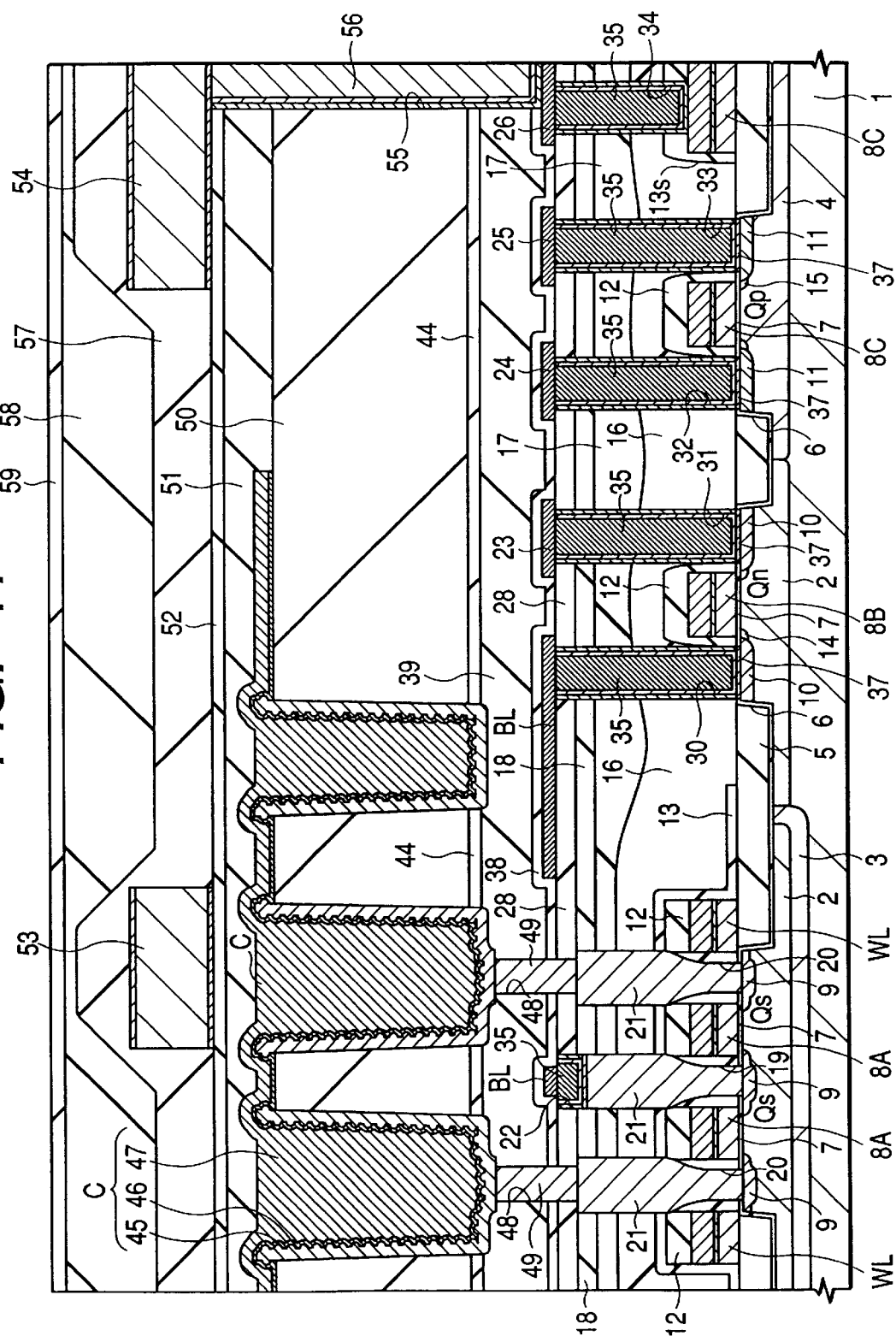
FIG. 41 is a fragmentary cross-sectional view of the semiconductor substrate, depicting a step of the method of manufacturing the DRAM according to one embodiment of the present invention.

Next, silicon oxide films 58 and 59 are deposited over the silicon oxide film 57 as shown in FIG. 41. The silicon oxide films 58 and 59 are deposited by the plasma CVD method in which, for example, the oxygen (or ozone) and tetra ethoxy silane are used for the source gas. The silicon oxide film 57 is excellent in gap-filling characteristic but poor in film flatness. Therefore, it is desirable that in order to reduce a grounding step-like offset or difference between interconnections 60, 61 and 62 corresponding to a third wiring layer, the silicon oxide film 58 is deposited over the silicon oxide film 57 and the surface thereof is flattened by the CMP method. The silicon oxide film 59 is deposited to mend or fix micro flaws on the surface of the silicon oxide film 58, which are produced when polished by the CMP method.

Figure 42:
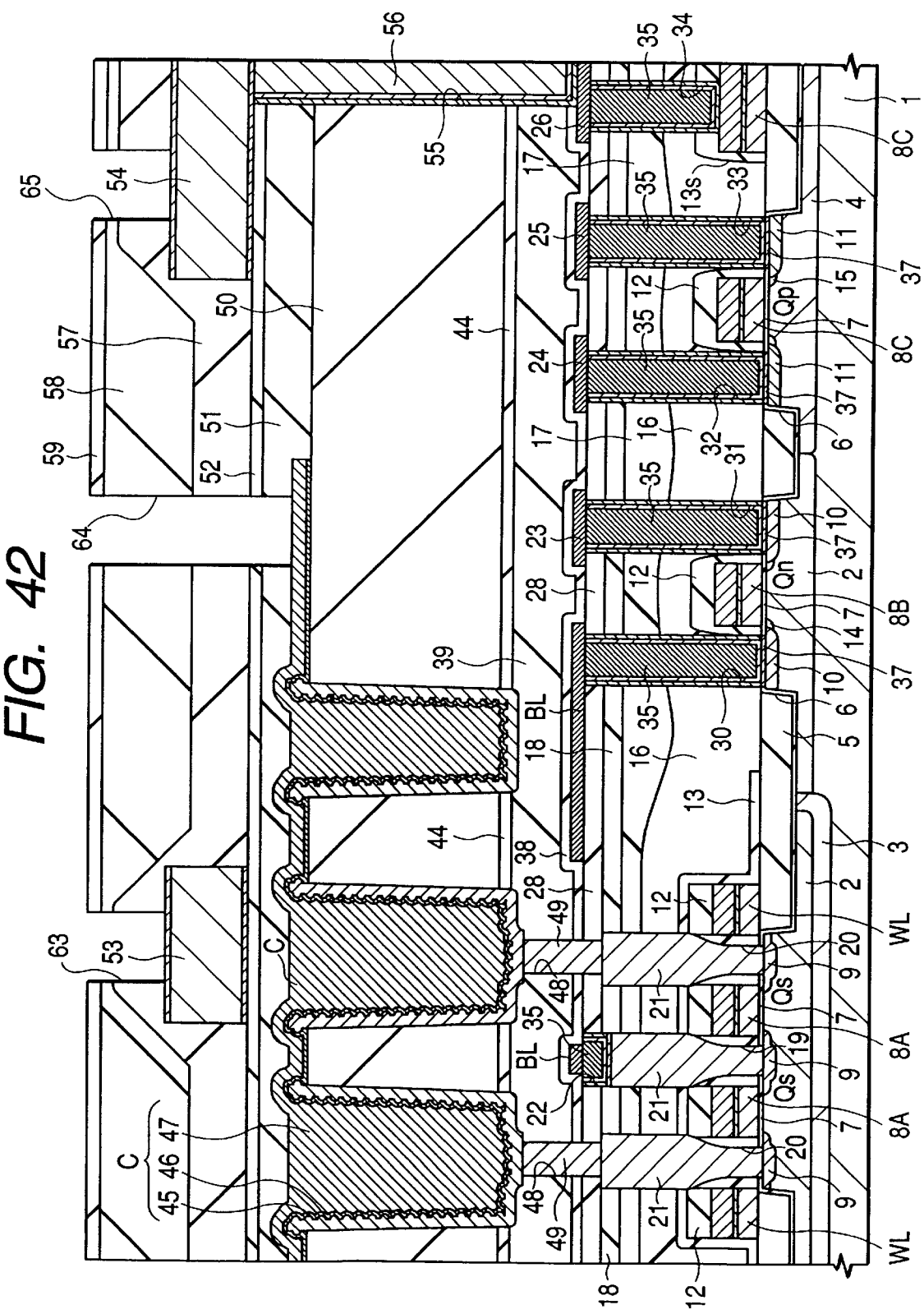
FIG. 42 is a fragmentary cross-sectional view of the semiconductor substrate, illustrating a step of the method of manufacturing the DRAM according to one embodiment of the present invention.

Next, the silicon oxide films 59, 58, 57, 52 and 51 are etched using a photoresist (not shown) as a mask as shown in FIG. 42. As a result, a through hole 64 is defined in a portion above the upper electrode 47 of each information storage capacitive element C. Simultaneously at this time, the silicon oxide films 59, 58 and 57 are etched to define a through hole 63 above the interconnection 53 of the second wiring layer formed in the memory array and define a through hole 65 above the interconnection 54 of the second wiring layer formed in the peripheral circuit region.

Since the through hole 64 defined above the upper electrode 47 is formed as shown in FIG. 42 by etching the silicon oxide films (59, 58, 57, 52 and 51) corresponding to five layers, the through hole 64 is different in aspect ratio from the through holes 63 and 65 defined by etching the silicon oxide films (59, 58 and 57) corresponding to three layers. Since, however, the interconnections 53 and 54 corresponding to the second wiring layer are respectively formed at the bottoms of the through holes 63 and 65 and these interconnections 53 and 54 serve as etching stoppers, the bottoms of the through holes 63 and 65, which are smaller than the through hole 64 in aspect ratio, are not cut even when the through holes 63, 64 and 65 having a different aspect ratio are simultaneously defined.

Thereafter, plugs 66 are formed inside the through holes 63, 64 and 65. Afterwards, the interconnections 60, 61 and 62 corresponding to the third wiring layer are formed over the silicon oxide film 59, whereby the DRAM shown in FIG. 3 is substantially completed.

The plugs 66 are formed by, for example, depositing a Ti film over the silicon oxide film 59 by sputtering, depositing a TiN film and a W film over the Ti film by the CVD method and etching back these films to thereby leave the same inside the through holes 63, 64 and 65. Further, the interconnections 63, 64 and 65 corresponding to the third wiring layer are formed by, for example, successively depositing a TiN film, an Al alloy film, a Ti film and a TiN film over the silicon oxide film 59 by sputtering and thereafter patterning these films by dry etching using a photoresist film as a mask.

A predetermined source of power is supplied to the upper electrode 47 of each information storage capacitive element C from the interconnection (feeding interconnection) 61 of the third wiring layer via the through hole 64. The interconnection 60 corresponding to the third wiring layer formed in the memory array is electrically connected to the interconnection 53 of the second wiring layer via the through hole 63, and the interconnection 54 of the third wiring layer formed in the peripheral circuit region is electrically connected to the interconnection 54 of the second wiring layer via the through hole 65.

While a passivation film comprised of, for example, a film or the like obtained by laminating the silicon oxide film and the silicon nitride film deposited by the CVD method is formed over the interconnections 63, 64 and 65 corresponding to the third wiring layer, it is omitted from the drawing. Bonding pads are formed by an electric conductor film identical in layer to the interconnection of the third wiring layer. Openings for respectively exposing the bonding pads are defined in the passivation film.

According to the above-described embodiments, since the silicon oxide film 57, which is deposited by the high-density plasma CVD method, and possessing a feature in that it has an excellent gap-filling characteristic, whereas it is easy to develop charge-up according to electrical charges in a plasma, is formed before the formation of the feeding interconnection 61, the charged-up electrical charge is transferred to each upper electrode 47 via the feeding interconnection 61 and the through hole 64. Thus, no damage to each information storage capacitive element C occurs.

While the invention made by the present inventors has been described specifically with reference to an embodiment of the invention, the present invention is not limited thereto. It is needless to say that various changes can be made thereto within the scope not departing from the substance of the invention.

The power may be supplied to the upper electrode of each information storage capacitive element through an interconnection corresponding to a fourth wiring layer or an interconnection formed in a layer thereabove, for example.

Effects obtained by a typical one of the features disclosed in the present application will briefly be described as follows:

According to the present invention, when a through hole is defined in an insulating film between a feeding interconnection for supplying power to an upper electrode of each information storage capacitive element and the upper electrode, it is possible to prevent the bottom of the through hole from extending through the upper electrode. It is therefore possible to improve the connection reliability of the feeding interconnection.

According to the present invention as well, the formation of an insulating film which is easy to produce charge-up before the formation of the feeding interconnection allows prevention of electric breakdown of each information storage capacitive element, which is caused by the charge-up of the insulating film.

According to the present invention, since each information storage capacitive element and a second wiring layer are electrically insulated from each other when an insulating film easy to produce charge-up is formed over the second wiring layer, an electrical charge supplied to the second wiring layer is not transferred to the capacitive element, and electrical breakdown of the information storage capacitive element, which is caused by the charge-up, can be prevented.

The above-described effect can be achieved even when the information storage capacitive element and the second wiring layer are electrically connected to each other through a third wiring layer after the formation of the insulating film which is easy to produce charge-up formed over the second wiring layer, for example.

When each MISFET sufficiently acts as a charge barrier, the above-mentioned effect can be achieved even when the second wiring layer is electrically connected to the information storage capacitive element through the MISFET.

According to the present invention, a process step for defining a first through hole in an insulating film provided between a feeding interconnection for supplying a predetermined potential to an upper electrode of each information storage capacitive element and the upper electrode, and a process step for defining a second through hole in an insulating film provided between a first interconnection and a second interconnection in a peripheral circuit region are separately performed. It is thus possible to prevent the first through hole from extending through or penetrating the upper electrode of each information storage capacitive element, thereby to improve the connection reliability of the feeding interconnection.

Further, the process step for defining the first through hole in the insulating film provided between the feeding interconnection for supplying the predetermined potential to the upper electrode of each information storage capacitive element and the upper electrode, and a process step for defining a third through hole in an insulating film provided between a second interconnection and a third interconnection in the peripheral circuit region are performed in the same process step, thereby making it possible to achieve a reduction in the number of process steps.

Furthermore, since the first and third through holes are defined in a configuration in which the first through hole is deeper than the third through hole, the first through hole can be completely opened and the upper electrode of each information storage capacitive element can be set to such an etching condition as not to be extremely over-etched. It is thus possible to prevent the first through hole from penetrating the upper electrode of each information storage capacitive element, thereby to improve the connection reliability of the feeding interconnection.

Since the depth of the third through hole is shallower than that of the first through hole, the second interconnection is over-etched in the third through hole. However, the problems such as the penetration of the second interconnection, etc. can be avoided by sufficiently ensuring an etching selection ratio between the insulating film on the second interconnection and the second interconnection. Since the second interconnection is thicker than the upper electrode, a problem concerning the reliability of the connection to the third interconnection dose not occur even if it is slightly over-etched.

What is claimed is:

1. A method of manufacturing a semiconductor integrated circuit device, comprising the steps of:

forming memory cell selection MISFETs in a memory array region on a main surface of a semiconductor substrate and forming MISFETs for a peripheral circuit in a peripheral circuit region;

forming a first interconnection over the main surface of said semiconductor substrate with the MISFETs formed therein;

forming a first insulating film over said first interconnection;

defining grooves in said first insulating film in said memory array region;

forming a first conductive film over said first insulating film including the interior of said grooves and forming a lower electrode of an information storage capacitive element inside said each groove;

forming a second conductive film over said lower electrode with a capacitive insulating film interposed therebetween, and patterning said second conductive film to thereby form each upper electrode of said information storage capacitive element;

forming a second insulating film over said each information storage capacitive element;

defining a first through hole in an insulating film including said second insulating film and said first insulating film placed in a layer therebelow;

forming a third conductive film over said second insulating film and patterning said third conductive film to thereby form a second interconnection electrically connected to said first interconnection via said first through hole;

forming a third insulating film over said second interconnection;

defining a second through hole in said third insulating film provided over said each information storage capacitive element and defining a third through hole in said third insulating film provided over said second interconnection; and forming a fourth conductive film over said third insulating film and patterning said fourth conductive film to thereby form a feeding interconnection layer electrically connected to the upper electrode of said each information storage capacitive element via said second through hole, and a third interconnection electrically connected to said second interconnection via said third through hole.

2. The method according to claim 1, wherein said step of forming the third insulating film over the second interconnection includes a step of forming an insulating film by a high-density plasma CVD method, and said step of forming the second insulating film over said information storage capacitive element excludes the step of forming the insulating film by the high-density plasma CVD method.

3. The method according to claim 2, wherein said step of forming the insulating film by the high-density plasma CVD method is a step of forming a silicon oxide film by a high-density plasma CVD method using a source gas containing monosilane, oxygen and an inert gas.

4. The method according to claim 2, wherein said step of forming the third insulating film over the second interconnection further includes a step of forming a fourth insulating film over the insulating film formed by the high-density plasma CVD method, and a step of flattening said fourth insulating film over the surface thereof by a chemical mechanical polishing method.

5. The method according to claim 1, wherein said feeding interconnection and said third interconnection are formed in the same step.

6. The method according to claim 1, wherein said first interconnection includes a bit line.

7. A method of manufacturing a semiconductor integrated circuit device, comprising the steps of:

forming MISFETs over a main surface of a semiconductor substrate;

forming a capacitive element electrically connected to said each MISFET over said each MISFET;

forming a first insulating film for surrounding a peripheral portion of said capacitive element;

forming a first interconnection over said first insulating film;

forming a second insulating film over said first interconnection;

defining a first opening for exposing a capacitive element at the bottom of an insulating film including said second insulating film;

defining a second opening for exposing said first interconnection at the bottom of the insulating film including said second insulating film;

forming a first plug within said first opening; and forming a second plug within said second opening.

8. The method according to claim 7, wherein said step of defining said first opening and said step of defining said second opening are simultaneously performed.

9. The method according to claim 7, wherein the depth of said first opening is greater than that of said second opening.

10. The method according to claim 7, further including a step of forming a first interconnection below said first insulating film, a step of defining a third opening for exposing said first interconnection in said first insulating film; and a step of forming a third plug within said third opening.

11. The method according to claim 7, wherein the thickness of said first insulating film is substantially the same degree as the height of said capacitive element.

* * * * *